(12) United States Patent
Hideki

(10) Patent No.: US 6,849,892 B2
(45) Date of Patent: Feb. 1, 2005

(54) PHASE CHANGEABLE MEMORY DEVICES HAVING REDUCED CELL AREAS

(75) Inventor: Horii Hideki, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/617,958

(22) Filed: Jul. 11, 2003

(65) Prior Publication Data

US 2004/0042298 A1 Mar. 4, 2004

(30) Foreign Application Priority Data

Aug. 20, 2002 (KR) ................................ 10-2002-0049137

(51) Int. Cl.[7] .............................................. H01L 29/76

(52) U.S. Cl. ........................ 257/298; 257/298; 257/248

(58) Field of Search ................................. 257/298, 248, 257/154, 3, 4, 295, 5; 365/148; 438/95

(56) References Cited

U.S. PATENT DOCUMENTS

| | | | | |
|---|---|---|---|---|
| 5,341,328 A | * | 8/1994 | Ovshinsky et al. | 365/163 |
| 5,350,705 A | * | 9/1994 | Brassington et al. | 257/295 |
| 5,952,671 A | * | 9/1999 | Reinberg et al. | 257/3 |
| 6,030,548 A | * | 2/2000 | Kuriyama | 257/368 |
| 6,545,903 B1 | * | 4/2003 | Wu | 365/148 |
| 6,733,956 B2 | * | 5/2004 | Maimon et al. | 430/314 |

* cited by examiner

*Primary Examiner*—David Nelms
*Assistant Examiner*—Thinh T Nguyen
(74) *Attorney, Agent, or Firm*—Myers Bigel Sibley & Sajovec, P.A.

(57) ABSTRACT

Phase changeable memory devices include an integrated circuit substrate and first and second storage active regions on the integrated circuit substrate. The first and second storage active regions have a first width and a second width, respectively. A transistor active region on the integrated circuit substrate is between the first and second active regions, the first and seconds widths being less than a width of the transistor active region.

20 Claims, 18 Drawing Sheets

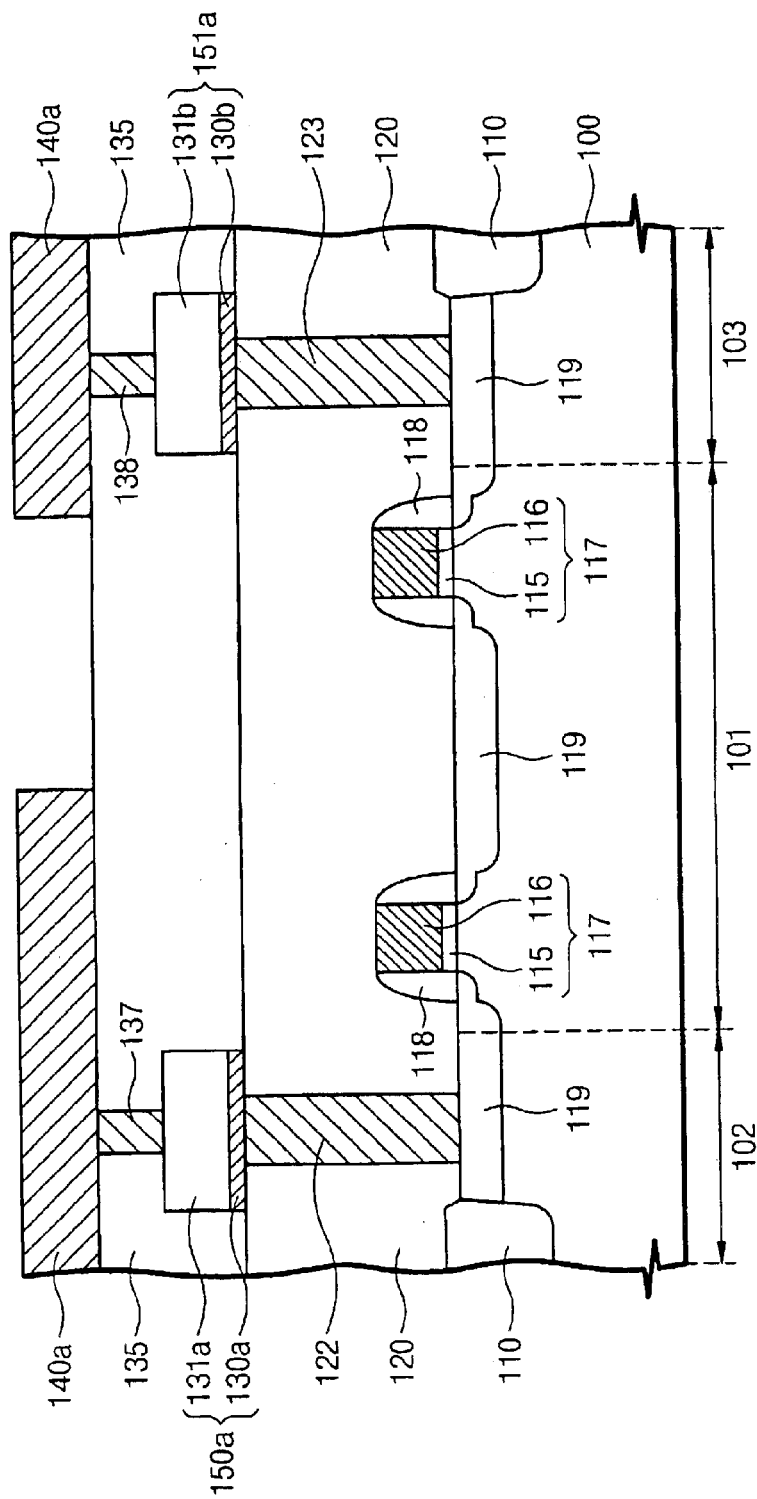

PHASE CHANGEABLE MEMORY DEVICES HAVING REDUCED CELL AREAS

CLAIM FOR PRIORITY

This application claims priority to Korean Patent Application No. 2002-49137, filed Aug. 20, 2002, the entire content of which is hereby incorporated herein by reference.

FIELD OF THE INVENTION

The present invention relates to integrated circuit devices and methods of fabricating integrated circuit devices and, more particularly, to phase changeable memory devices and methods of fabricating the same.

BACKGROUND

Integrated circuit memory devices can be volatile or non-volatile memory devices. In a volatile memory device, for example, a dynamic random access memory (DRAM) and a synchronous random access memory (SRAM), data may be lost when power is cut off. In a non-volatile memory device, for example, a flash memory, data is retained when power is cut off.

Typically, flash memory cells have a gate pattern that includes a gate insulating layer, a floating gate, a dielectric layer and a control gate that are sequentially stacked on a substrate. The flash memory cells may use tunneling to program and/or erase data therein. When a tunnel is present in the gate insulating layer an operating voltage that is higher than a power supply voltage may be necessary. Accordingly, conventional flash memory devices may include a booster that enables the flash memory device to apply enough voltage to program and/or erase data.

Recently, a new-type of non-volatile memory device, for example, a phase changeable memory device, has been proposed to replace or supplement existing non-volatile memory devices. Referring now to FIG. 1, an equivalent circuit diagram of a unit cell of conventional phase changeable memory devices will be discussed. As illustrated in FIG. 1, the phase changeable memory cell includes an access transistor Ta and a variable resistor C. The variable resistor C includes a lower electrode, an upper electrode and a phase changeable material layer disposed therebetween. The upper electrode of the variable resistor C is connected to a plate electrode PL. The access transistor Ta includes a source region, a drain region and a gate electrode. The source region is connected to the lower electrode of the variable resistor C and the drain region is spaced apart from the source region. The gate electrode of the access transistor Ta is located over a channel region between the source and drain regions. The gate electrode and drain region of the access transistor Ta are connected to a word line WL and a bit line BL, respectively. Accordingly, the equivalent circuit diagram of the phase changeable memory device is similar to that of a DRAM cell. However, properties of the phase changeable material layer are different from a dielectric layer used in a DRAM cell. For example, the phase changeable material layer may have two stable states based on a temperature.

Referring now to FIG. 2, a graph illustrating steps of programming and erasing the phase changeable memory cell will be discussed. The "X" axis represents a time T and the "Y" axis represents a temperature TMP of the phase changeable material layer. As illustrated in FIG. 2, when the phase changeable material layer is heated at a temperature higher than a melting temperature Tm for a first duration T1 and cooled, the phase changeable material layer changes into an amorphous state (curve 1). However, when the phase changeable material layer is heated at a temperature between the melting temperature Tm and a crystallization temperature Tc for a period between the first duration T1 and a second duration T2 and cooled, the phase changeable material layer changes into a crystalline state (curve 2). The second duration T2 is typically longer than the first duration Ti. In this case, a resistivity of the phase changeable material layer in the amorphous state is typically larger than that in the crystalline state. Thus, by detection of an amount of current flowing through the phase material layer during a read cycle, it may be unable to discriminate between data having a value of "0" and data having a value of "1" stored in the phase changeable memory cell. The phase changeable material layer generally includes a compound material layer such as germanium (Ge), tellurium (Te) and antimony (Sb) (GTS).

Referring now to FIG. 3, a plan view illustrating a portion of a cell array of conventional phase changeable memory devices will be discussed. As illustrated in FIG. 3, a plurality of active regions 10 are two-dimensionally disposed on an integrated circuit substrate. A plurality of gate lines 20 are disposed crossing over the active regions 10. The gate lines 20 correspond to word lines. The active regions 10 are disposed beneath a plurality of gate lines 20, for example, two gate lines 20. As illustrated, the active regions 10 are divided into three regions by the plurality of gate lines 20. A portion of the active region 10 between the plurality of gate lines 20 may correspond to a common drain region 11. Portions of the active region 10 on either side of the common drain region 11 may correspond to source regions 12 and 13. The common drain region 11, one of the source regions 12 and 13 and the gate line 20 provide a transistor. In other words, each active region 10 includes two unit cells.

The common drain region 11 is electrically connected to bit line 30 through bit line contact hole 25. A plurality of bit lines 30 cross over the gate lines 20. A phase changeable material pattern 40 is disposed over the source region. The phase changeable material pattern 40 is electrically connected to the source regions 12 and 13 under the phase changeable material pattern 40, through a heater plug (not shown) in a contact hole 35. The phase changeable material pattern 40 is electrically connected to the plate electrode (not shown) over the phase changeable memory device.

The phase changeable material pattern 40 may be formed of GTS and the heater plug may be formed of titanium nitride (TiN). To program desired data into the phase changeable pattern 40, the density of current flowing through the heater plug may be increased. Thus, a diameter of the heater plug may be decreased and a channel width A of the transistor may be increased to provide increased current to the heater plug. Accordingly, an area B of a cell or cells may be increased to accommodate the needed increased current capacity of the transistor. Accordingly, improved phase changeable integrated circuit devices may be desired.

SUMMARY

Embodiments of the present invention provide a phase changeable memory device including an integrated circuit substrate and first and second storage active regions on the integrated circuit substrate. The first and second storage active regions have a first width and a second width, respectively. A transistor active region on the integrated circuit substrate is between the first and second active regions, the first and seconds widths being less than a width of the transistor active region.

In some embodiments of the present invention the first and second widths may be equal and may be about half of the width of the transistor active region. In certain embodiments of the present invention a plurality of gate lines defining a plurality of rows of the phase changeable memory device are provided. A plurality of the first and second storage active regions may be disposed alternately along the rows in a region between first and second gate lines of the plurality of gate lines.

In further embodiments of the present invention the transistor active region may include first and second sidewalls that extend from a first end of the transistor active region to a second end of the transistor active region. The first storage active region may protrude from the first sidewall of the transistor active region at the first end of the transistor active region. The second storage region may protrude from the second sidewall of the transistor active region at the second end of the transistor active region.

In still further embodiments of the present invention the transistor active region may be a first transistor active region. The device may further include a second transistor active region and a connector active region between the first transistor active region and the second transistor active region that electrically couples the first and second transistor active regions.

In some embodiments of the present invention a first data storage element may be provided on the first storage active region and a second data storage element may be provided on the second storage active region. First and second lower plugs that electrically couple the first data storage element and the second data storage element, respectively, to the first and second storage active regions, respectively, may also be provided.

In further embodiments of the present invention the device may further include a plurality of bit lines on the integrated circuit substrate. A first upper plug that electrically couples a first bit line of the plurality of bit lines to the first data storage element may be provided. A second upper plug that electrically couples a second bit line of the plurality of bit lines to the second data storage element may also be provided.

In still further embodiments of the present invention the first data storage element may include a first barrier pattern that is electrically coupled to the first lower plug and a first phase changeable material pattern on the first barrier pattern. The second data storage element may include a second barrier pattern that is electrically coupled to the second lower plug and a second phase changeable material pattern on the second barrier pattern. In certain embodiments of the present invention, the first and second upper plugs may include heater plugs that generate heat to provide a phase transformation of the first phase changeable material pattern and the second phase changeable material pattern, respectively. A diameter of the first lower plug may be larger than a diameter of the first upper plug and a diameter of the second lower plug may be larger than a diameter of the second upper plug.

In some embodiments of the present invention the device further includes a common source interconnection on the integrated circuit substrate and a common source plug that electrically couples the common source interconnection to the transistor active region. An interlayer dielectric may be provided on the integrated circuit substrate. The common source plug may be disposed in the interlayer dielectric and the common source interconnection may be disposed in the interlayer dielectric on the common source plug.

In further embodiments of the present invention the first data storage element may include a first phase changeable material pattern that is electrically coupled to the first lower plug and a first barrier pattern on the first phase changeable material pattern. The second data storage element may include a second phase changeable material pattern that is electrically coupled to the second lower plug and a second barrier pattern on the second phase changeable material pattern. The first and second lower plugs may include heater plugs that generate heat to provide a phase transformation of the first phase changeable material pattern and the second phase changeable material pattern, respectively. A diameter of the first lower plug may be less than a diameter of the first upper plug and a diameter of the second lower plug may be less than a diameter of the second upper plug.

In still further embodiments of the present invention the device may further include a common source interconnection on the integrated circuit substrate and a common source plug that electrically couples the common source interconnection to the transistor active region. An interlayer dielectric may be provided on the integrated circuit substrate. The common source plug may be disposed in the interlayer dielectric and the common source interconnection may be disposed in the interlayer dielectric on the common source plug.

In some embodiments of the present invention the device may further include a first data storage element on the first storage active region and a second data storage element on the second storage active region. First and second lower plugs may be provided on the integrated circuit substrate. First and second buffer patterns may be provided on the first and second lower plugs. A first intermediate plug may be provided on the first buffer pattern that electrically couples the first data storage element to the first storage active region. A second intermediate plug may be provided on the second buffer pattern that electrically couples the second data storage element to the second data storage region.

In further embodiments of the present invention the device may further include a plurality of bit lines on the integrated circuit substrate and a first upper plug that electrically couples a first bit line of the plurality of bit lines to the first data storage element. A second upper plug that electrically couples a second bit line of the plurality of bit lines to the second data storage element may also be provided.

In still further embodiments of the present invention the first data storage element may include a first barrier pattern that is electrically coupled to the first intermediate plug and a first phase changeable material pattern on the first barrier pattern. The second data storage element may include a second barrier pattern that is electrically coupled to the second intermediate plug and a second phase changeable material pattern on the second barrier pattern. The first and second upper plugs may include heater plugs that generate heat to provide a phase transformation of the first phase changeable material pattern and the second phase changeable material pattern, respectively.

In some embodiments of the present invention the device may further include a common source interconnection on the integrated circuit substrate and a common source plug that electrically couples the common source interconnection to the transistor active region. An interlayer dielectric may be provided on the integrated circuit substrate. The common source plug may be disposed in the interlayer dielectric and the common source interconnection may be disposed on the interlayer dielectric.

In further embodiments of the present invention the first data storage element may include a first phase changeable material pattern that is electrically coupled to the first intermediate plug and a first barrier pattern on the first phase changeable material pattern. The second data storage element may include a second phase changeable material pattern that is electrically coupled to the second intermediate plug and a second barrier pattern on the second phase changeable material pattern. The first and second intermediate plugs may include heater plugs that generate heat to provide a phase transformation of the first phase changeable material pattern and the second phase changeable material pattern, respectively.

In still further embodiments of the present invention the device may further include a common source interconnection on the integrated circuit substrate and a common source plug that electrically couples the common source interconnection to the transistor active region. An interlayer dielectric may be provided on the integrated circuit substrate. The common source plug may be disposed in the interlayer dielectric and the common source plug is disposed on the interlayer dielectric.

While the present invention is described above primarily with reference to phase changeable memory devices, methods of fabricating phase changeable memory devices are also provided.

BRIEF DESCRIPTION OF THE DRAWINGS

FIG. 7A is a cross-sectional view taken along a line I–I' of FIG. 6 illustrating phase changeable memory devices according to some embodiments of the present invention.

DESCRIPTION OF EMBODIMENTS ACCORDING TO THE INVENTION

Figure 1:
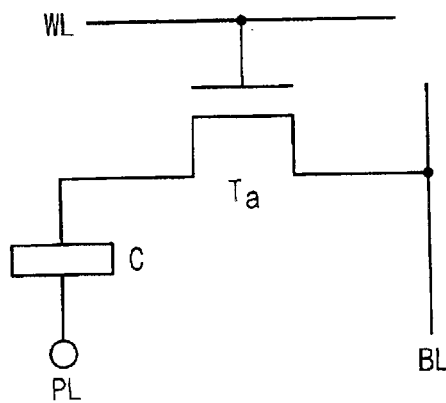
FIG. 1 is an equivalent circuit diagram illustrating a unit cell of typical phase changeable memory devices.
Figure 2:
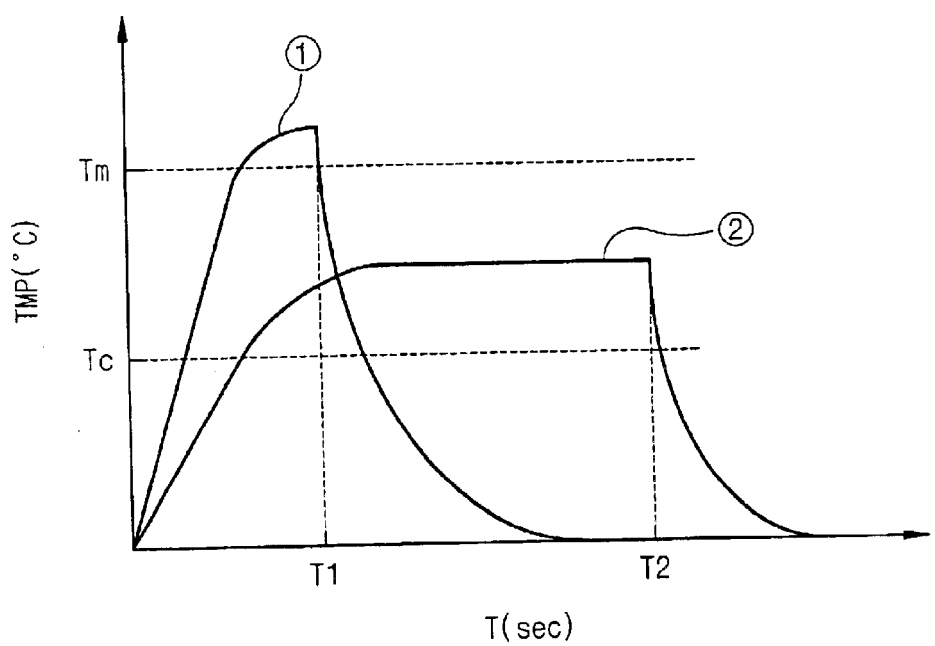
FIG. 2 is a graph illustrating properties of a phase changeable material used in conventional phase changeable memory cells.
Figure 3:
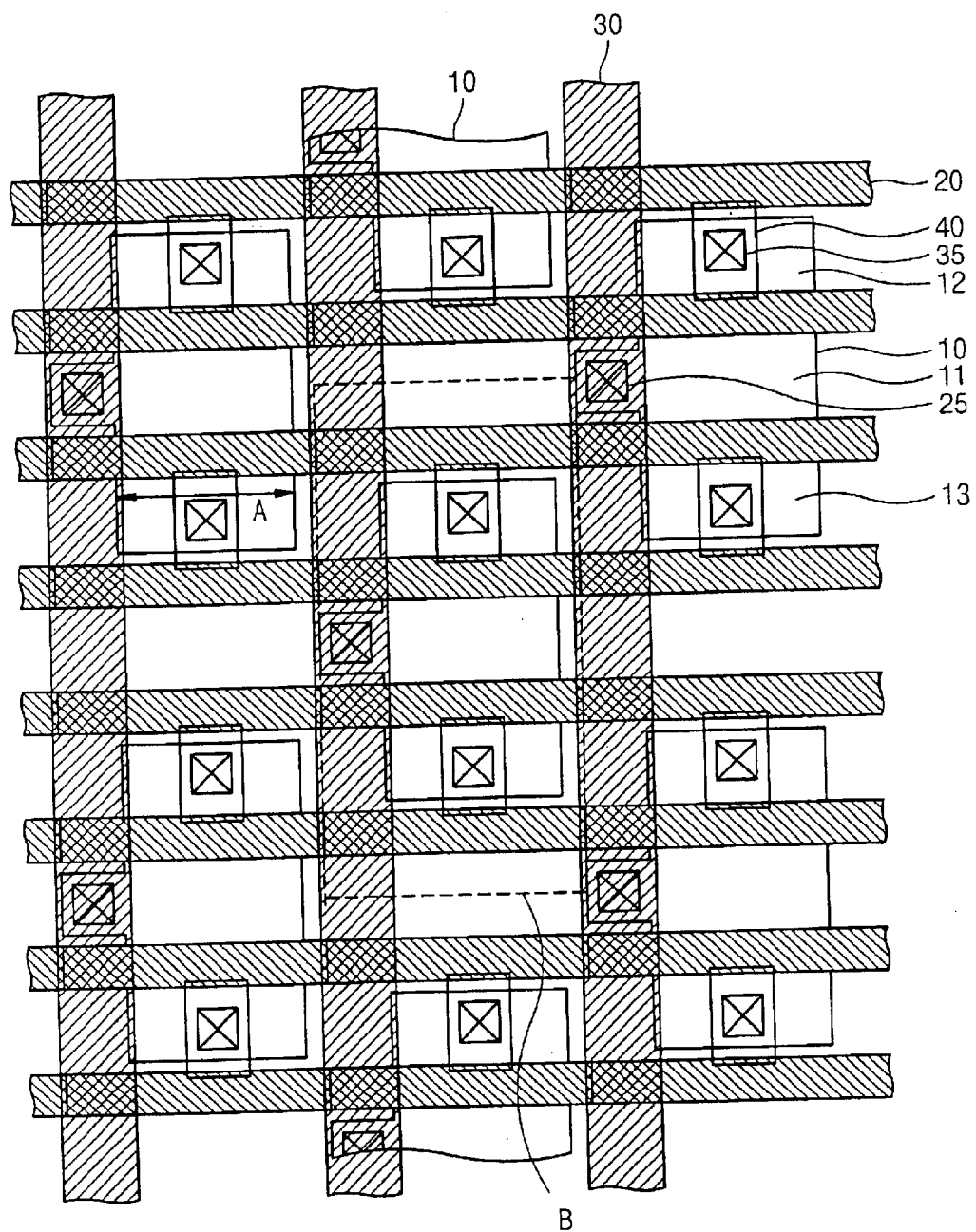
FIG. 3 is a plan view illustrating a portion of a memory cell array in conventional phase changeable memory devices.

The invention now will be described more fully hereinafter with reference to the accompanying drawings, in which embodiments according to the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when a layer is referred to as being "on" another layer, it can be directly on the other layer or intervening layers may be present. In contrast, when a layer is referred to as being "directly on" another layer, there are no intervening layers present. Like reference numerals refer to like elements throughout.

Embodiments of the present invention will be described below with respect to FIGS. 4 through 16. Embodiments of the present invention provide a phase changeable memory device including an integrated circuit substrate, a first storage active region on the integrated circuit substrate having a first width, a second storage active region on the integrated circuit substrate having a second width and a transistor active region on the integrated circuit substrate between the first and second active regions. The first and seconds widths of the first and second storage active regions, respectively, are less than a width of the transistor active region. In certain embodiments, the first and second widths of the first and second storage active regions, respectively, are about half the width of the transistor active region. Providing phase changeable memory devices having first and second storage active regions with smaller widths relative to the width of the transistor active region may allow the cell areas of phase changeable memory devices to be decreased. Moreover, reducing the widths of the first and second storage active regions can reduce the cross sectional areas of the respective storage active regions. Thus, a smaller device may be provided according to embodiments of the present invention as discussed further below.

Figure 4:
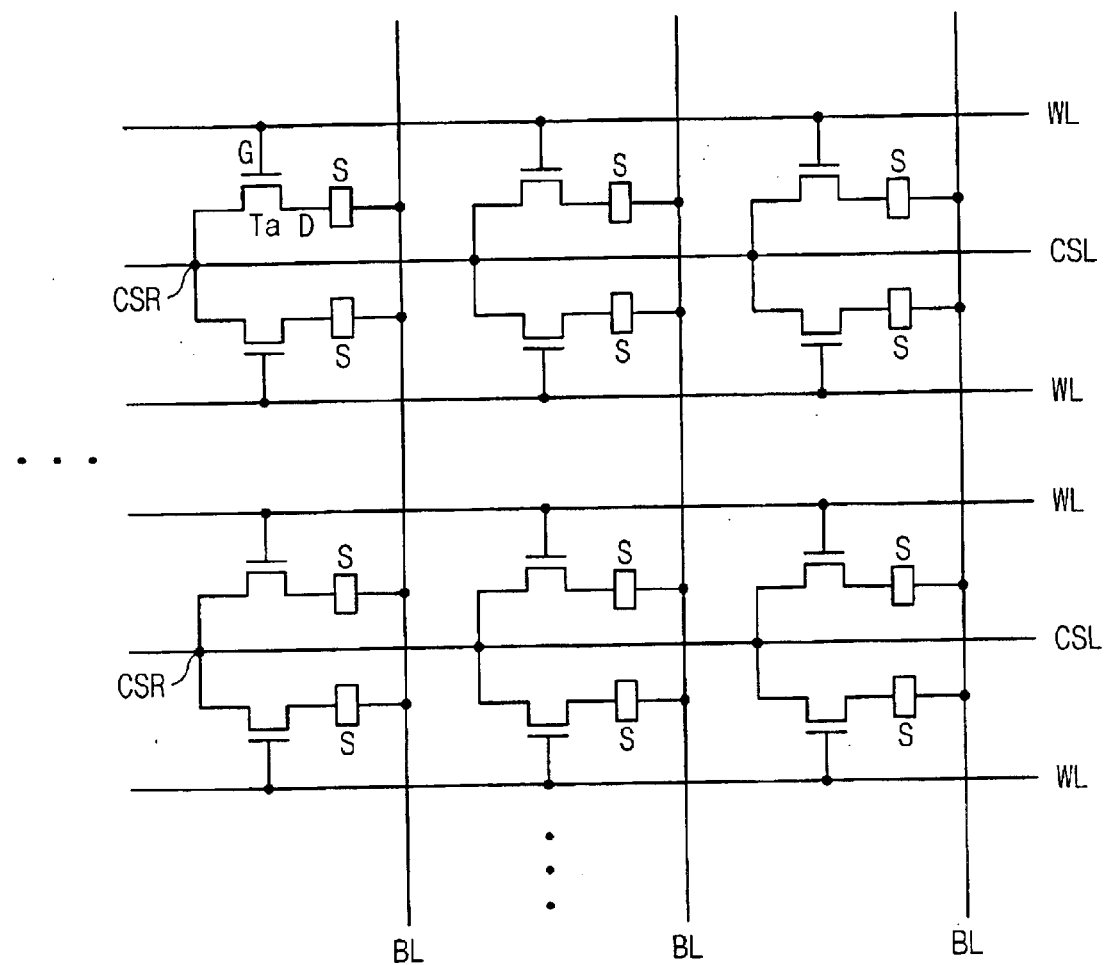
FIG. 4 is an equivalent circuit diagram of a memory cell array of phase changeable memory devices according to some embodiments of the present invention.

Referring now to FIG. 4, an equivalent circuit diagram illustrating a cell array of phase changeable memory devices according to embodiments of the present invention will be discussed. As illustrated in FIG. 4, a cell array of phase changeable memory devices according to embodiments of the present invention may include a plurality of phase changeable memory cells that are arranged in two dimensions. Ones of the phase changeable memory devices include an access transistor Ta and a data storage element S. The data storage element S has a phase changeable material pattern. The access transistor Ta comprises a drain region D, a common source region CSR and a gate electrode G. The drain region D is connected to the data storage element S. The common source region CSR is spaced apart from the drain region D. The gate electrode G is disposed over a channel region between the drain region D and the common source region CSR. The gate electrode G and the common source region CSR of the access transistor Ta are coupled to a word line WL and a common source line CSL, respectively. The data storage element S is coupled to a bit line BL. The word line WL crosses over the bit line BL and is parallel to the common source line CSL. Accordingly, as illustrated in FIG. 4, certain embodiments of phase changeable memory devices according to embodiments of the present invention do not include the plate electrode present in conventional devices, for example, as illustrated in FIG. 1. It will be understood that embodiments of phase changeable memory devices illustrated in FIG. 4 are provided for exemplary purposes only and that embodiments of the present invention are not limited to this configuration.

Operations of phase changeable memory devices illustrated in FIG. 4 according to embodiments of the present invention will be discussed. To program phase changeable memory devices according to embodiments of the present invention, a gate on voltage is applied to a word line WL of a memory cell selected from the plurality of phase changeable memory cells. A gate off voltage is applied to another of the word lines WL, i.e. not the word line WL of the selected cell. A ground voltage is applied to a common source line CSL that is connected to the selected memory cell and a program voltage is applied to a bit line BL of the selected cell so as to allow the phase changeable material pattern to be programmed to store data.

Figure 5:
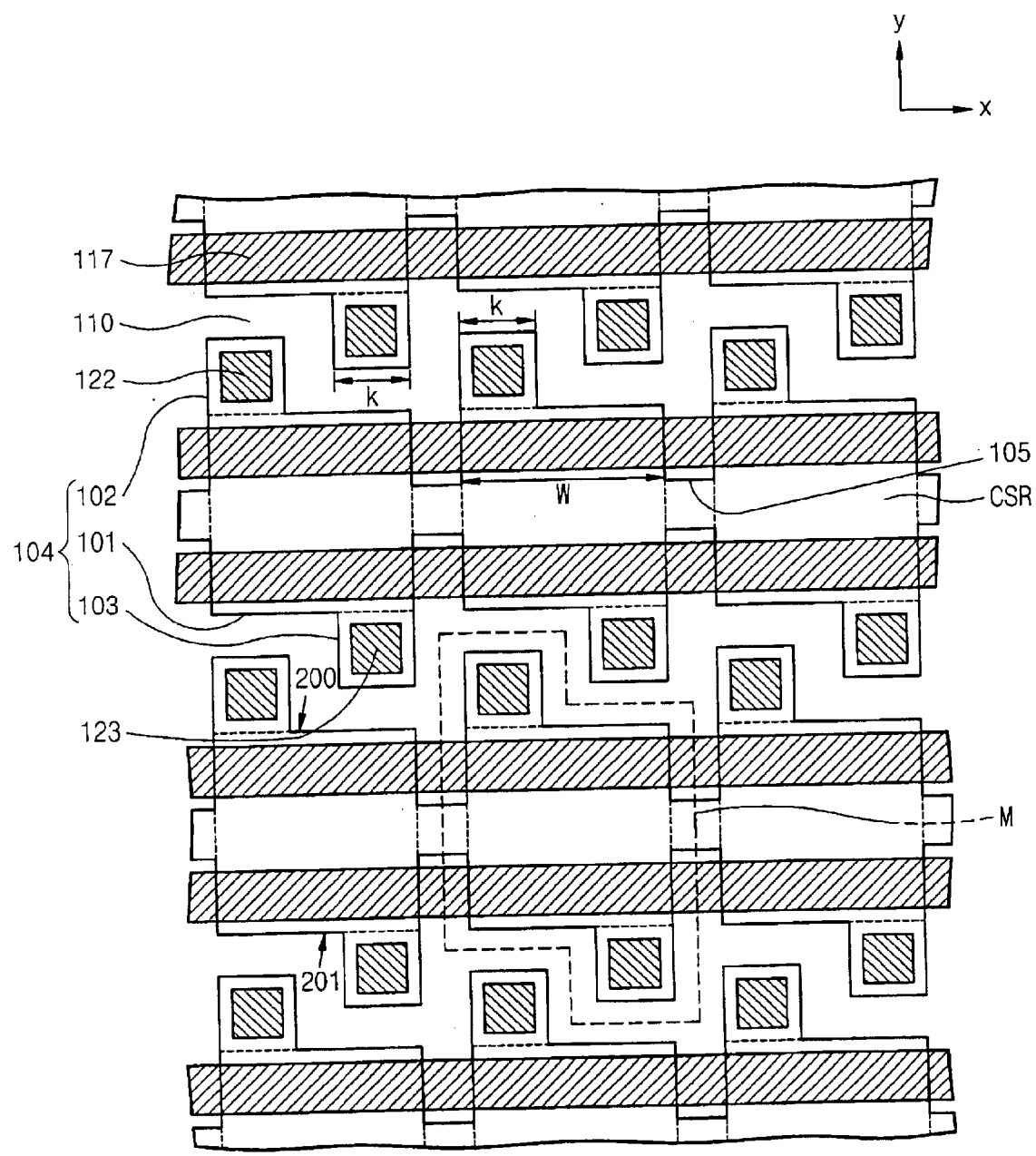
FIGS. 5 and 6 are plan views of phase changeable memory devices according to further embodiments of the present invention.
Figure 6:
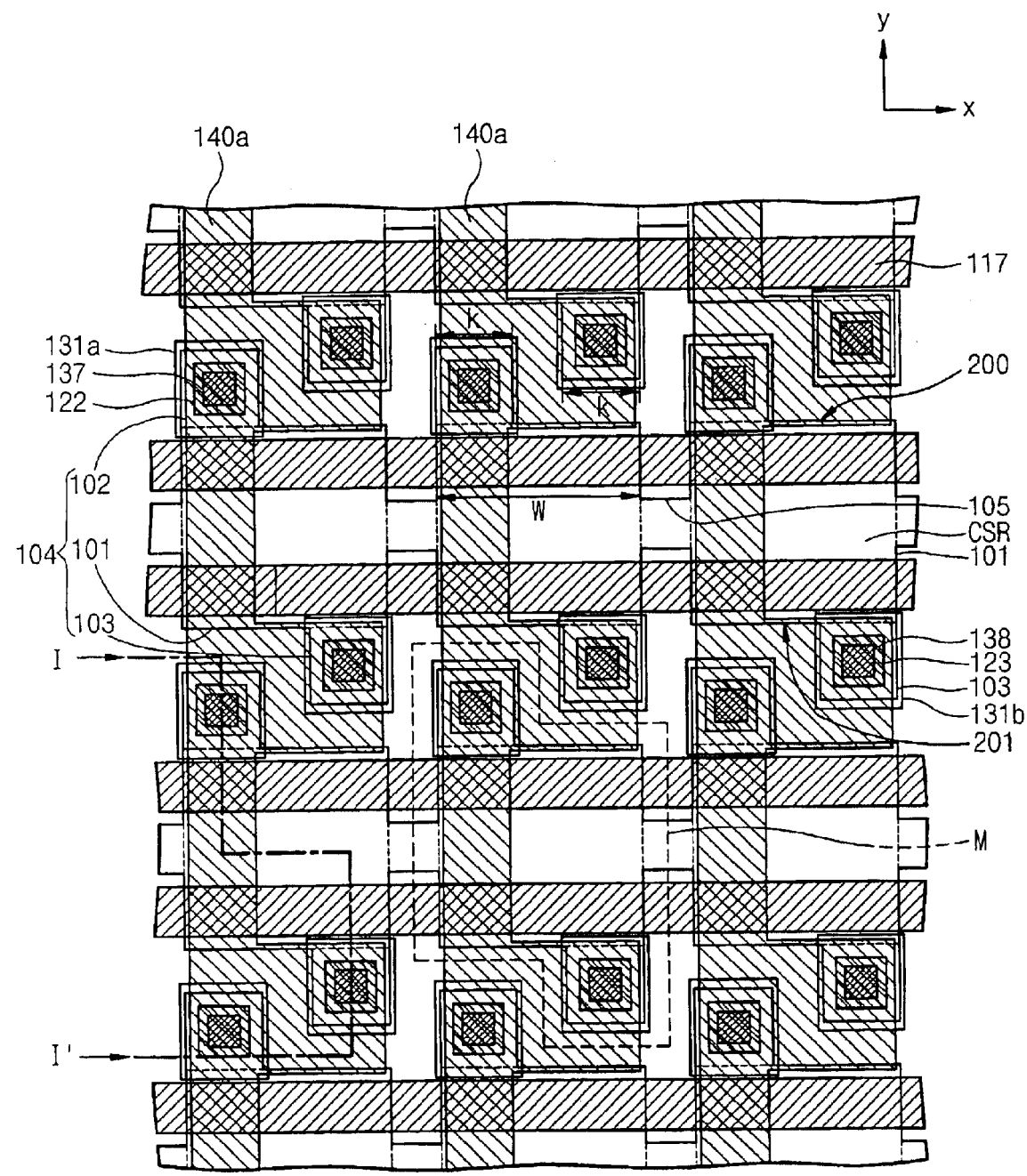
Figure 7B:
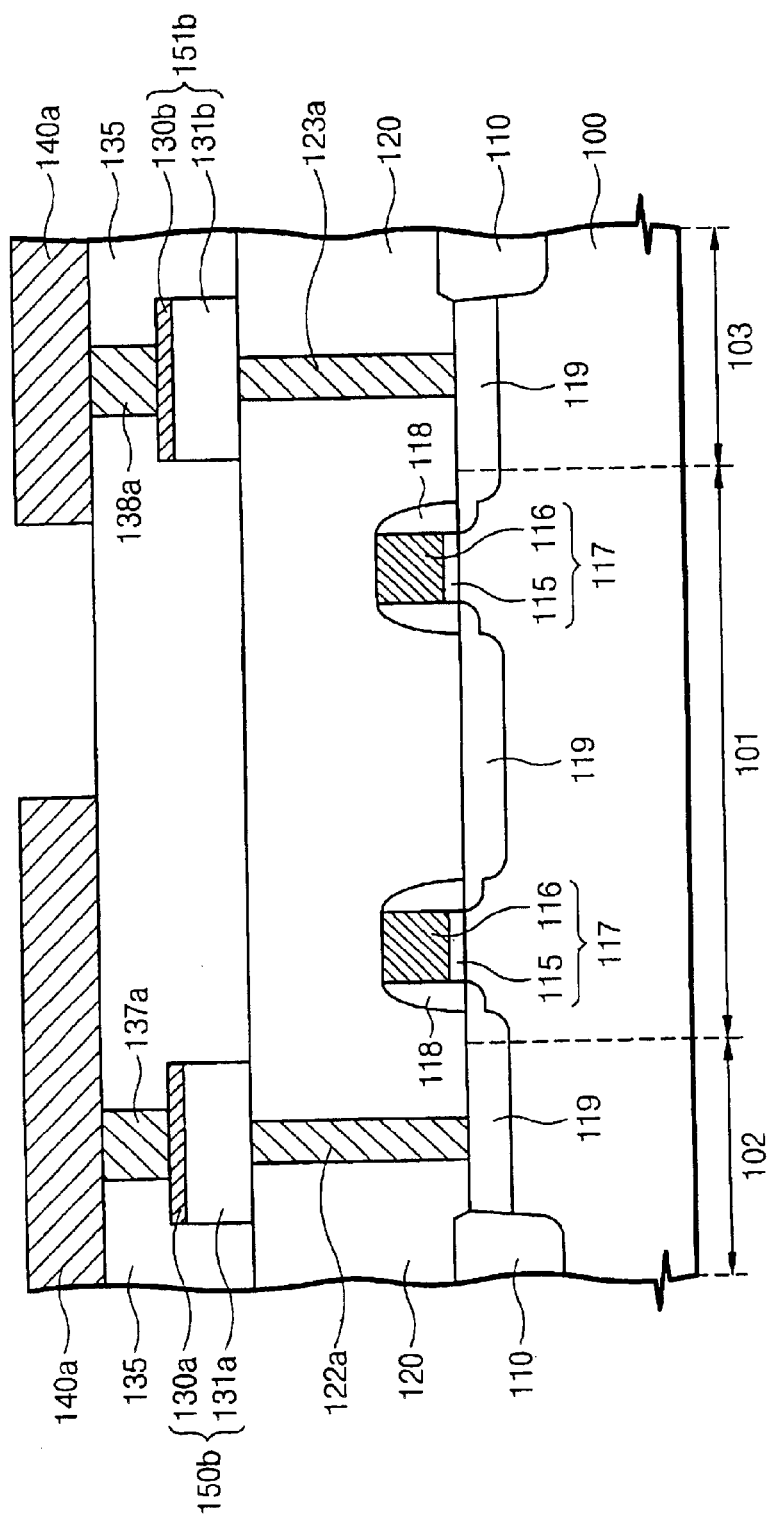
FIG. 7B is a cross-sectional view taken along a line I–I' of FIG. 6 illustrating phase changeable memory devices including heater plugs and data storage elements according to further embodiments of the present invention.

FIGS. 5 and 6 illustrate plan views of phase changeable memory devices according to embodiments of the present invention. FIG. 7A is a cross-sectional view taken along a line of I–I' of FIG. 6 illustrating phase changeable memory devices according to some embodiments of the present invention and FIG. 7B is a cross-sectional view taken along a line of I–I' of FIG. 6 illustrating phase changeable memory devices including heater plugs and data storage elements according to further embodiments of the present invention.

Referring now to FIGS. 5, 6, 7A and 7B, a plurality of active regions 104 are two-dimensionally disposed on an integrated circuit substrate 100 along rows and columns. The rows are parallel to an "X" axis and the columns are parallel to a "Y" axis. As illustrated in FIG. 5, the active region 104 includes a transistor active region 101, a first storage active region 102 and a second storage active region 103. The transistor active region 101 includes first and second sidewalls 200 and 201 and each of the first and second sidewalls having first and second ends. The first storage active region 102 protrudes from the first sidewall 200 at the first end of the first sidewall 200 and the second storage active region 103 protrudes from the second sidewall 201 at the second end of the second sidewall 201 to define respective interfaces between the transistor active region 101 and the first and second storage active regions 102 and 103. The first and second sidewalls 200 and 201 may be parallel to each other and parallel to the rows.

The first and second storage active regions 102 and 103 are disposed at both sides of a center line that crosses over a center of the transistor active region 101 and the first and second sidewalls 200 and 201. As illustrated in FIG. 5, a device isolation layer 110 is provided on the integrated circuit substrate 100 between the active regions 104. A plurality of gate lines 117 are provided that cross over the transistor active regions 101. As illustrated, a plurality of gate lines 117, for example, two gate lines 117, cross over the transistor active region 101.

As illustrated in FIGS. 7A and 7B, impurity diffusion regions 119 are formed in an active region 104 on both sides of the gate line 117. The transistor active region 101 between the plurality of gate lines 117 may correspond to a common source region CSR. The first and second storage active regions 102 and 103 may correspond to drain regions. The gate lines 117 may correspond to word lines. The gate line 117, the common source region CSR and the drain regions compose a transistor. Accordingly, ones of the active regions 104 include two phase changeable memory cells. The gate line 117 includes a gate insulating pattern 115 on the substrate 100 and a gate electrode 116 on the gate insulating pattern 115. Spacers 118 may be provided on sidewalls of the gate line 117.

Ones of the transistor active regions 101 have a channel width W that is parallel to the row. The first and second storage active regions 102 and 103 have predetermined widths k parallel to the channel width W. The predetermined width k is less than the channel width W. For example, the predetermined width k may be equal to about half the channel width W. Thus, the predetermined widths k of the first and second storage active regions 102 and 103 may be decreased and therefore may decrease a cell area M compared to a cell area in a conventional phase changeable memory device.

As illustrated in FIGS. 5 and 6, the first and second storage active regions 102 and 103 are provided between an even row (one of the gate lines 117) and an adjoining odd row (another of the gate lines 117) and are disposed alternately along the rows. Alternating the first and second storage active regions 102 and 103 along the rows may also allow the cell array area of the phase changeable memory cell array to be decreased.

As further illustrated, connector active regions 105 are interposed between the common source regions CSR provided on ones of the rows. Ones of the connector active regions 105 are interposed between the adjoining two common source regions CSR in the row. The connector active regions 105 electrically couple adjoining common source regions CSR. In other words, the connector active regions 105 and the common source regions CSR in each of the rows correspond to a common source line.

A lower interlayer dielectric 120 is provided on the phase changeable device on the active regions 104, the connector active regions 105, the device isolation layer 110 and the gate lines 117. First and second data storage elements 150a and 151a are provided on the lower interlayer dielectric 120. The first and second data storage elements 150a and 151a are provided on the first and second storage active regions 102 and 103, respectively. A first lower plug 122 and a second lower plug 123 are provided in the lower interlayer dielectric 120.

The first lower plug 122 electrically couples the first storage active region 102 with the first data storage element 150a. Similarly, the second lower plug 123 electrically couples the second storage active region 103 with the second data storage element 151a. The first and second lower plugs 122 and 123 may include, for example, tungsten. The first and second lower plugs 122 and 123 may have predetermined diameters. The predetermined diameter of the first lower plug 122 may be equal to the predetermined diameter of the second lower plug 123. The first and second storage active regions 102 and 103 may have predetermined widths k that may be longer than the predetermined diameters of the first and second lower plugs 122 and 123. Furthermore, the predetermined widths k of the first and second storage active regions 102 and 103 may be longer than the predetermined diameters of the first and second lower plugs 122 and 123 and shorter than half the channel width W.

As illustrated in FIG. 7A, the first and second data storage elements 150a and 151a include first and second phase changeable material patterns 131a and 131b, respectively. The first and second phase changeable material patterns 131a and 131b may include a material layer, for example, a Germanium-Antimony-Tellurium (Ge—Sb—Te) layer. It will be understood that the material layer may include tellurium (Te) and/or selenium (Se), which belong to the Chalcogenide family of elements, without departing from the teachings of the present invention.

As illustrated in FIG. 7A, a first barrier pattern 130a may be provided between the first lower plug 122 and the first phase changeable material pattern 131a. Similarly, a second barrier pattern 130b may be provided between the second lower plug 123 and the second phase changeable material pattern 131b. The first barrier pattern 130a may inhibit a reaction between the first lower plug 122 and the first phase changeable material pattern 131a and the second barrier pattern 130b may inhibit a reaction between the second lower plug 123 and the second phase changeable material pattern 131b. For example, the first and second barrier patterns 130a and 130b may inhibit a reaction between the tungsten layer and the phase changeable material layer. The first and second barrier patterns 130a and 130b may include, for example, a metal nitride, such as titanium nitride and/or tantalum nitride.

An upper interlayer dielectric 135 is provided on the lower interlayer dielectric 120 and the first and second data storage elements 150a and 151a. The lower and upper interlayer dielectrics 120 and 135 may include, for example, a silicon oxide layer. A first upper plug 137 and a second upper plug 138 are provided in the upper interlayer dielectric 135. A plurality of bit lines 140a are provided on the first and second upper plugs 137 and 138. The first upper plug 137 electrically couples the first data storage element 150a with one of the bit lines 140a. The second upper plug 138 electrically couples the second data storage element 151a with one of the bit lines 140a. The first and second upper plugs 137 and 138 may be, for example, heater plugs. The heater plugs may include TiN, TaN, WN, MoN, NbN, TiSiN, TiAlN, TiBN, ZrSiN, WBN, ZrAlN, MoSiN, MoAlN, TaSiN, TaAlN, TiON, TiAlON, WON and/or TaON. The heater plugs may generate heat used for a phase transformation of the first phase changeable material pattern 131a and/or the second phase changeable material pattern 131b.

When a programming voltage is applied through the bit line 140a, heat is generated at interfaces between the phase changeable material patterns 131a and 131b and the first and second upper plugs 137 and 138 (i.e., heater plugs), respectively. Accordingly, a predetermined region of the phased changeable material patterns 130a and 131a may change into two stable states having different resistances. The first and second upper plugs 137 and 138 are in contact with the first and second phase changeable material patterns 131a and 131b, respectively. Diameters of the first and second upper plugs 137 and 138, i.e. the heater plugs, may be shorter than those of the first and second lower plugs 122 and 123, respectively.

In certain embodiments of the present invention, for example, embodiments of the present invention illustrated in FIG. 7B, the first and second lower plugs 122a and 123a may be the heater plugs instead of first and second upper plugs 137 and 138 as discussed above. As illustrated in FIG. 7B, the first and second phase changeable material patterns 131a and 131b are in contact with upper surfaces of the first and second lower plugs 122a and 123a. The first and second upper plugs 137a and 138a may include, for example, tungsten. The first barrier pattern 130a may be provided between the first upper plug 137a and the first phase changeable material pattern 131a and a second barrier pattern 130b may be provided between the second upper plug 138a and the second phase changeable material pattern 131b. It will be understood that the common source line is not limited to the common source line 105 (connector active regions) illustrated in some of the Figures of the present application Thus, the connector active regions 105 may be omitted in certain embodiments of the present invention as discussed further below.

Figure 8:
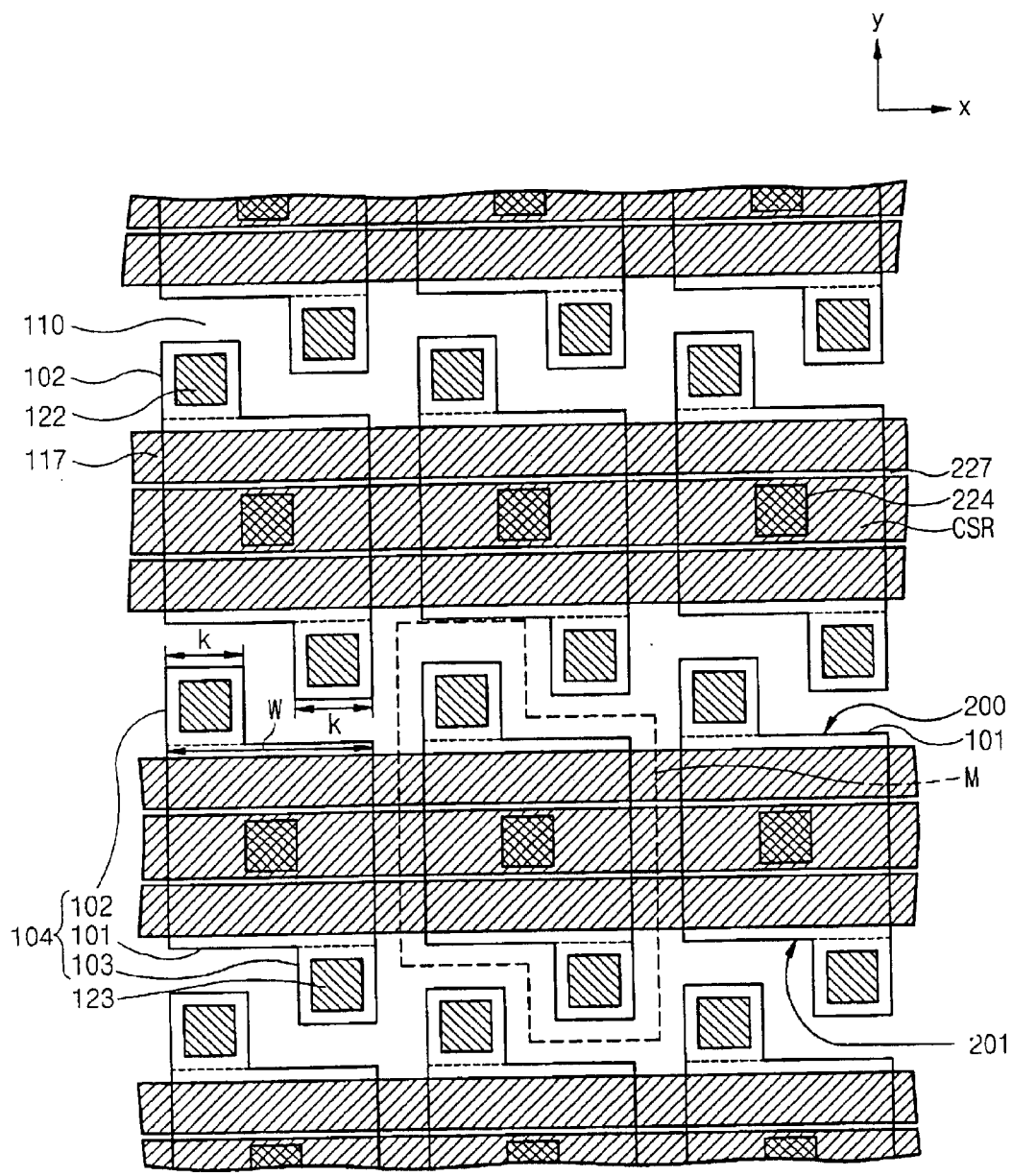
FIGS. 8 and 9 are plan views of phase changeable memory devices including common source lines according to some embodiments of the present invention.
Figure 9:
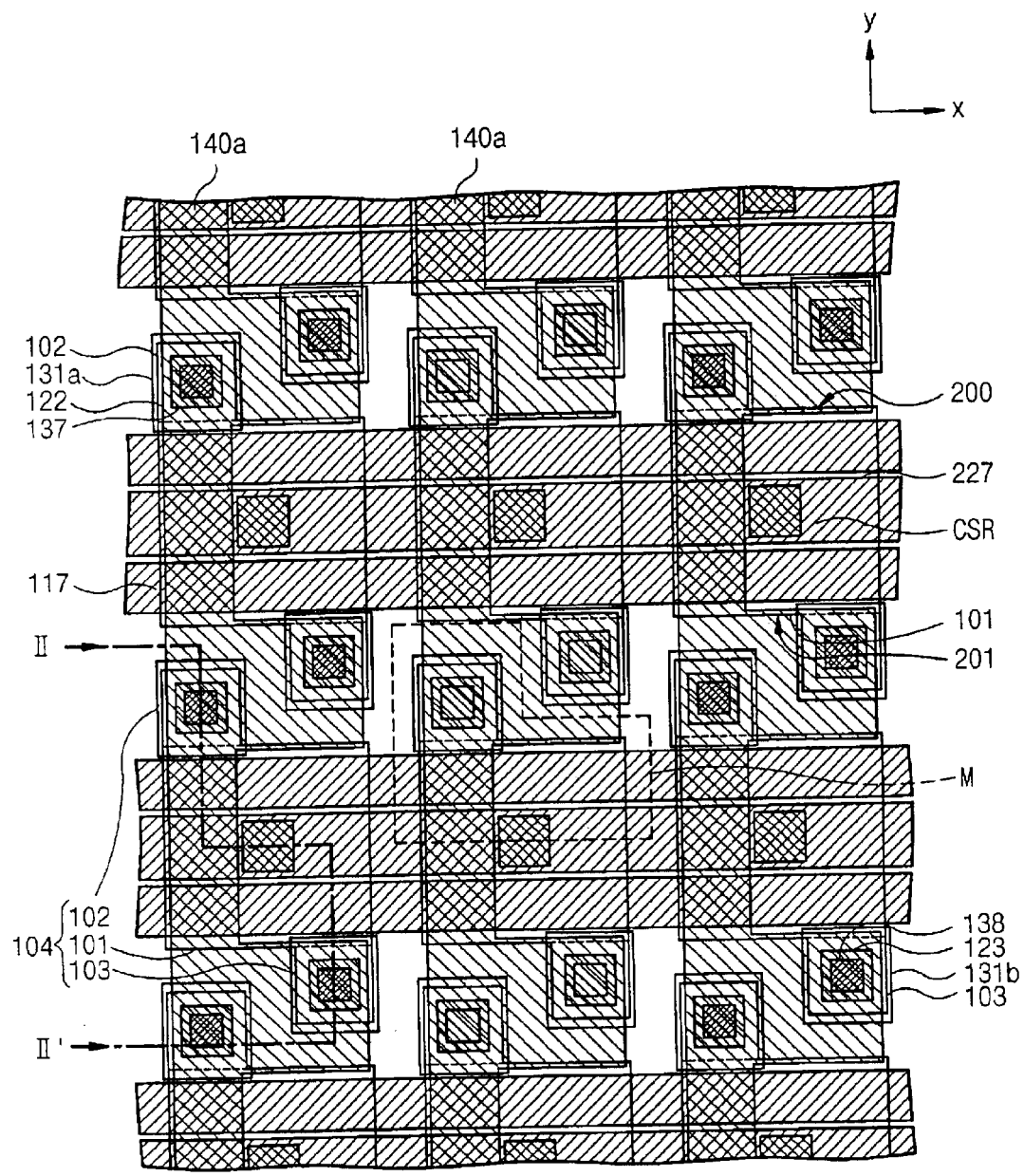
Figure 10A:
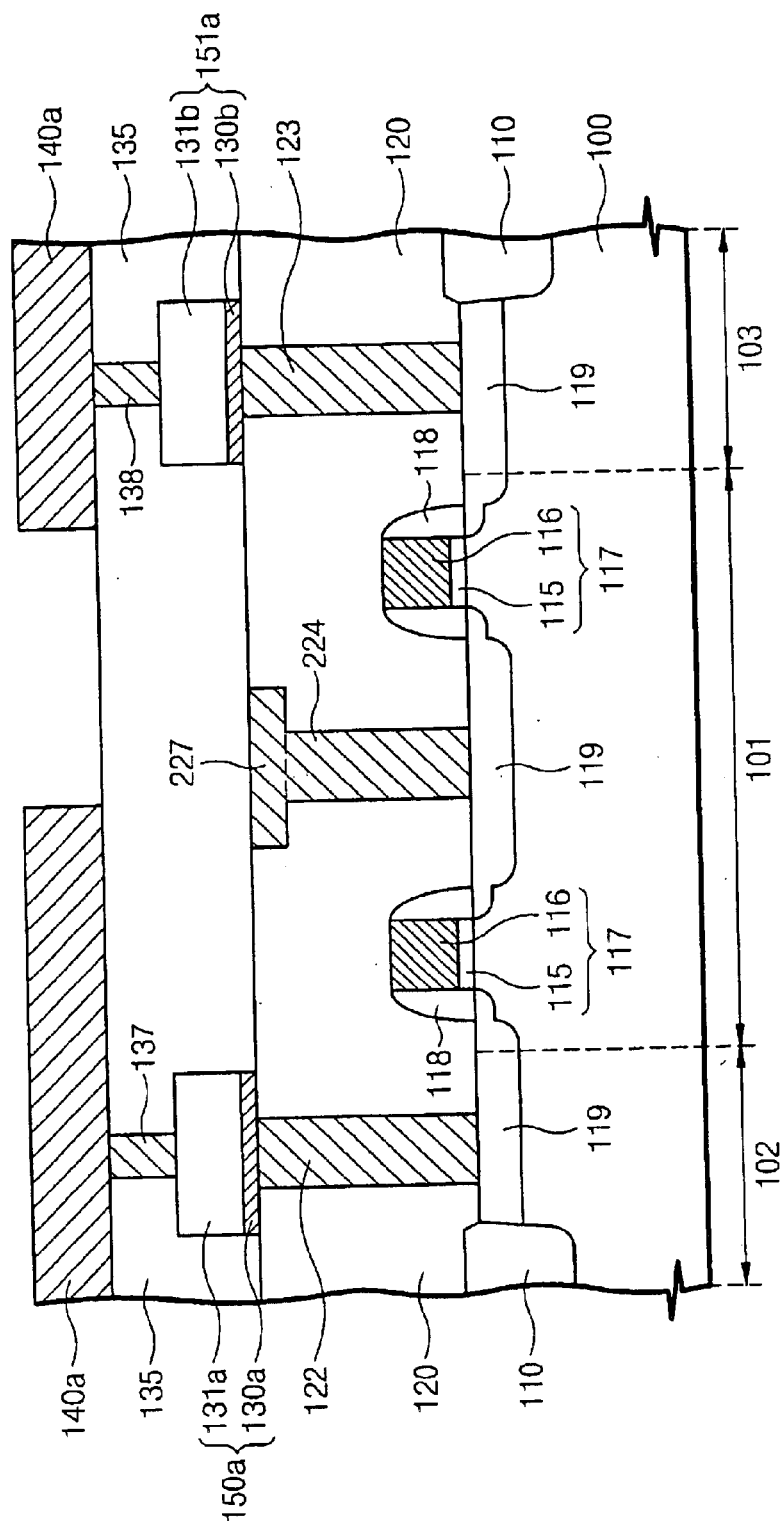
FIG. 10A is a cross-sectional view taken along a line II–II' of FIG. 9 illustrating phase changeable memory devices according to further embodiments of the present invention.
Figure 10B:
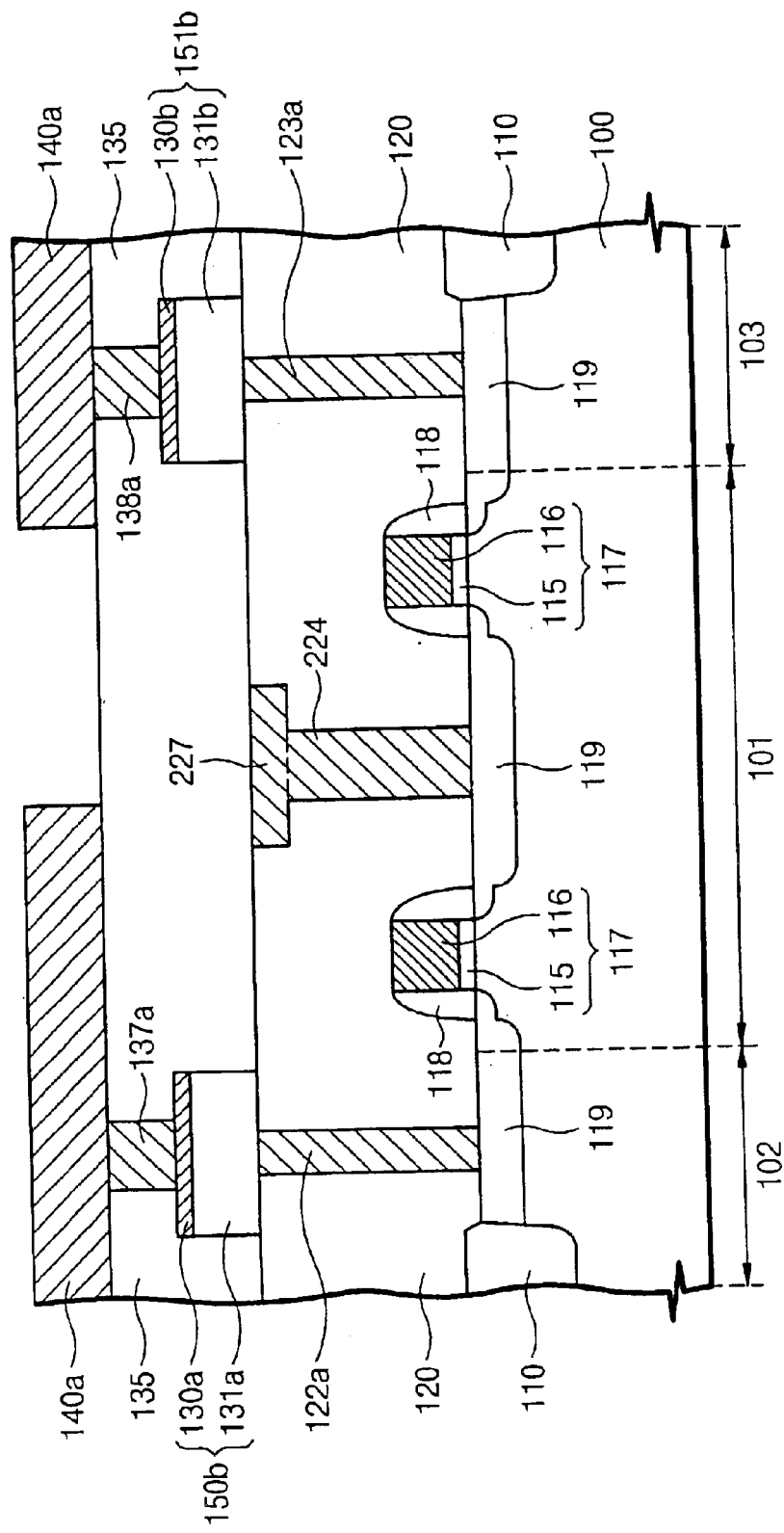
FIG. 10B is a cross-sectional view taken along a line II–II' of FIG. 9 illustrating phase changeable memory devices including heater plugs and data storage elements according to some embodiments of the present invention.

FIGS. 8 and 9 are plan views illustrating phase changeable memory devices having common source lines according to some embodiments of the present invention. FIG. 10A is a cross-sectional view taken along a line II–II' of FIG. 9 and FIG. 10B is a cross-sectional view taken along a line II–II' of FIG. 9 illustrating phase changeable memory devices having heater plugs and data storage elements according to further embodiments of the present invention.

Referring now to FIGS. 8, 9, 10A and 10B, active regions 104 and gate lines 117 are provided on an integrated circuit substrate 100. A lower interlayer dielectric 120 is provided on the integrated circuit substrate 100 on the active regions 104 and the gate lines 117. A plurality of common source interconnections 227 are provided on a lower interlayer dielectric 120. The common source interconnections 227 cross over the common source regions CSR. Lower surfaces of the common source interconnections 227 are spaced apart from a surface of the lower interlayer dielectric 120. Upper surfaces of the common source interconnections 227 are similar in height to the surface of the lower interlayer dielectric 120. The common source interconnections 227 are parallel to the gate lines 117. The common source interconnections 227 cross over the common source regions CSR disposed in the row. Common source plugs 224 are provided in the lower interlayer dielectric 120. A lower surface of the common source plug 224 contacts the common source region CSR. An upper surface of the common source plug 224 contacts the lower surface of a common source interconnection 227. In other words, the upper surface of the common source plug 224 is spaced apart from the surface of the lower interlayer dielectric 120. The common source interconnections 227 contact the upper surfaces of the common source plugs 224. The common source plugs 224 electrically connect the common source interconnection 227 to the common source regions CSR in the row. The common source interconnections 227 correspond to common source lines. In these embodiments of the present invention, the common source plugs 224 and the common source interconnections 227 may include, for example, tungsten.

First and second lower plugs 122 and 123, first and second data storage elements 150a and 151a, first and second upper plugs 137 and 138, and bit lines 140a are similar to the like numbered elements discussed above with respect to FIGS. 6 and 7A. As discussed, the first and second upper plugs 137 and 138 may include heater plugs. The lower surfaces of the first and second upper plugs 137 and 138 may be in contact with the first and second phase changeable material patterns 131a and 131b. Alternatively, the first and second lower plugs 122a and 123a may include the heater plugs as illustrated in FIG. 10B. In this case, the upper surfaces of the first and second lower plugs 122a and 123a are in contact with the first and second phase changeable material patterns 131a and 131b, respectively. It will be understood that a common source line may have many forms without departing from the teachings of the present invention. For example, in some embodiments of the present invention the common source interconnections 227 are located on the lower interlayer dielectric 120.

Figure 10C:
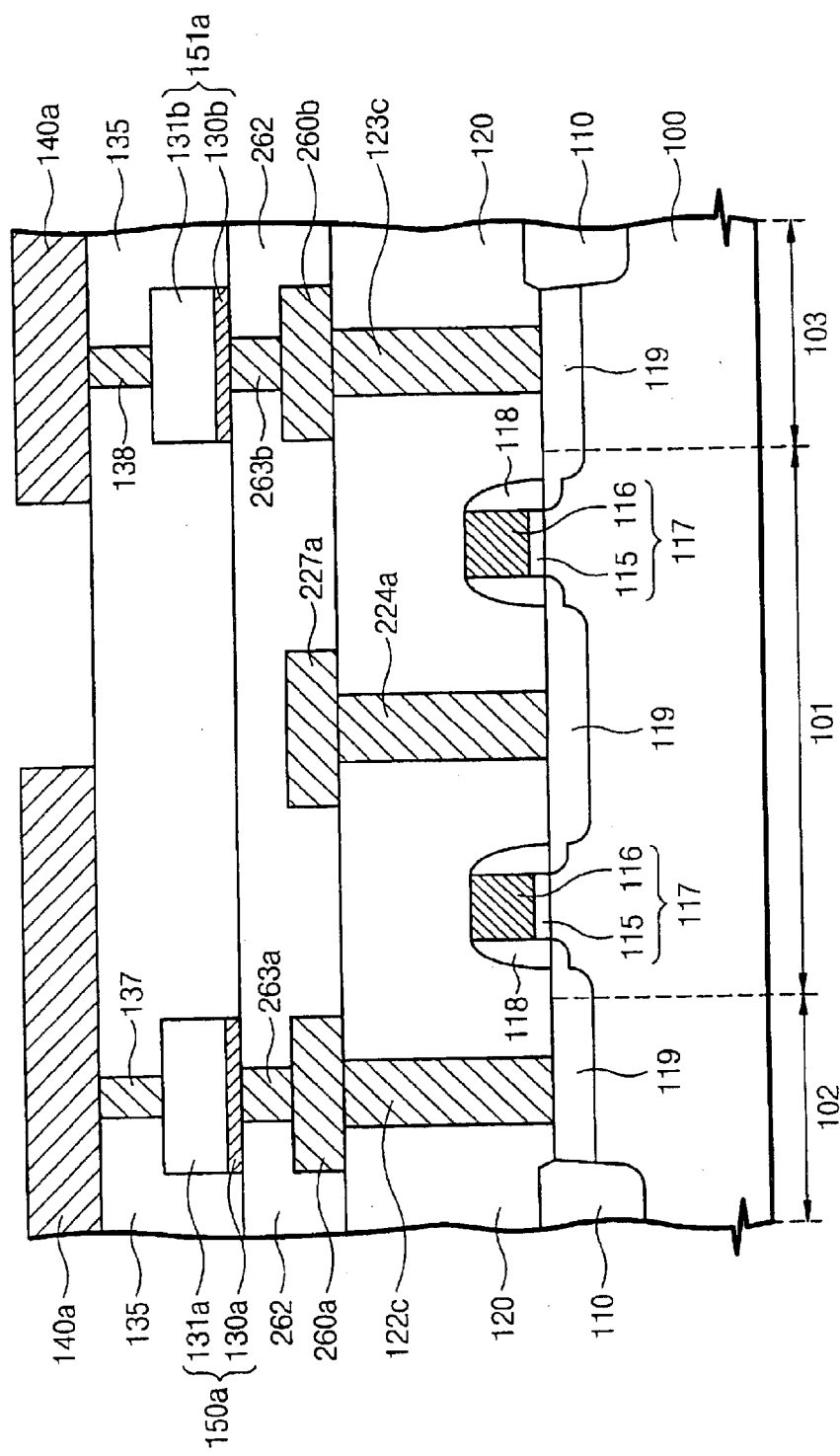
FIG. 10C is a cross-sectional view taken along a line of II–II' FIG. 9 illustrating phase changeable memory devices including common source lines according to further embodiments of the present invention.

FIG. 10C is a cross-sectional view taken along a ling II–II' of FIG. 9 illustrating phase changeable memory devices including common source lines according to some embodiments of the present invention. Referring now to FIGS. 9 and 10C, active regions 104 and gate lines 117 of FIGS. 6 and 7A are provided on an integrated circuit substrate 100. A lower interlayer dielectric 120 is provided on the active regions 104 and the gate lines 117. A plurality of common source interconnections 227a are disposed on the lower interlayer dielectric 120. The common source interconnections 227a cross over the common source regions CSR and extend in rows. Lower surfaces of the common source interconnections 227a are similar in height to a surface of the lower interlayer dielectric 120. In other words, upper surfaces of the common source interconnections 227a are spaced apart from the surface of the lower interlayer dielectric 120.

Common source plugs 224a are disposed in the lower interlayer dielectric 120 to contact common source regions. An upper surface of the common source plug 224a contacts the lower surface of the common source interconnection 227a. The common source plugs 224a electrically couple the common source regions CSR to the common source interconnections 227a. In other words, ones of the common source interconnections 227a are electrically coupled to the common source regions CSR disposed in ones of the rows.

First and second lower plugs 122c and 123c are provided on the first and second storage active regions 102 and 103. The first and second lower plugs 122c and 123c contact the first and second storage active regions 102 and 103 through the lower interlayer dielectric 120, respectively. First and second buffer patterns 260a and 260b may be disposed on the lower interlayer dielectric 120 and contact upper surfaces of the first and second lower plugs 122c and 123c, respectively.

An intermediate interlayer dielectric 262 is provided on the lower interlayer dielectric 120, the common source interconnections 227a, and the first and second buffer patterns 260a and 260b. First and second data storage elements 150a and 151b are provided on the intermediate interlayer dielectric 262 over the first and second storage active regions 102 and 103. First and second intermediate plugs 263a and 263b are provided in the intermediate interlayer dielectric 262. The first intermediate plug 213a electrically couples the first buffer pattern 260a to the first data storage element 150a. Similarly, the second intermediate plug 262b electrically couples the second buffer pattern 260b to the second data storage element 151a. An upper interlayer dielectric 135 is provided on the intermediate interlayer dielectric 262 and the first and second data storage elements 150a and 151a. Bit lines 140a are provided on the upper interlayer dielectric 135. First and second upper plugs 137 and 138 are disposed in the upper interlayer dielectric 135 and contact with first and second data storage elements 150a and 151a, respectively. The first and second upper plugs 137 and 138 in the row are in contact with the bit line 140a.

In these embodiments of the present invention, the first and second lower plugs 122c and 123c do not include heater plugs. In other words, one of the first intermediate plug 263a and the first upper plug 137 and one of the second intermediate plug 263b and the second upper plug 138 include heater plugs. The heater plugs are in contact with the first and second phase changeable material patterns 131a and 131b and may generate heat to provide a phase transformation of the first phase changeable material pattern 131a and/or the second phase changeable material pattern 131b.

The first and second intermediate plugs 263a and 263b may contact the first and second storage active regions 102 and 103, respectively, through the intermediate interlayer dielectric 262 and the lower interlayer dielectric 120. In these embodiments of the present invention, the first and second buffer patterns 260a and 260b and the first and second lower plugs 122c and 123c may not be necessary.

Figure 11:
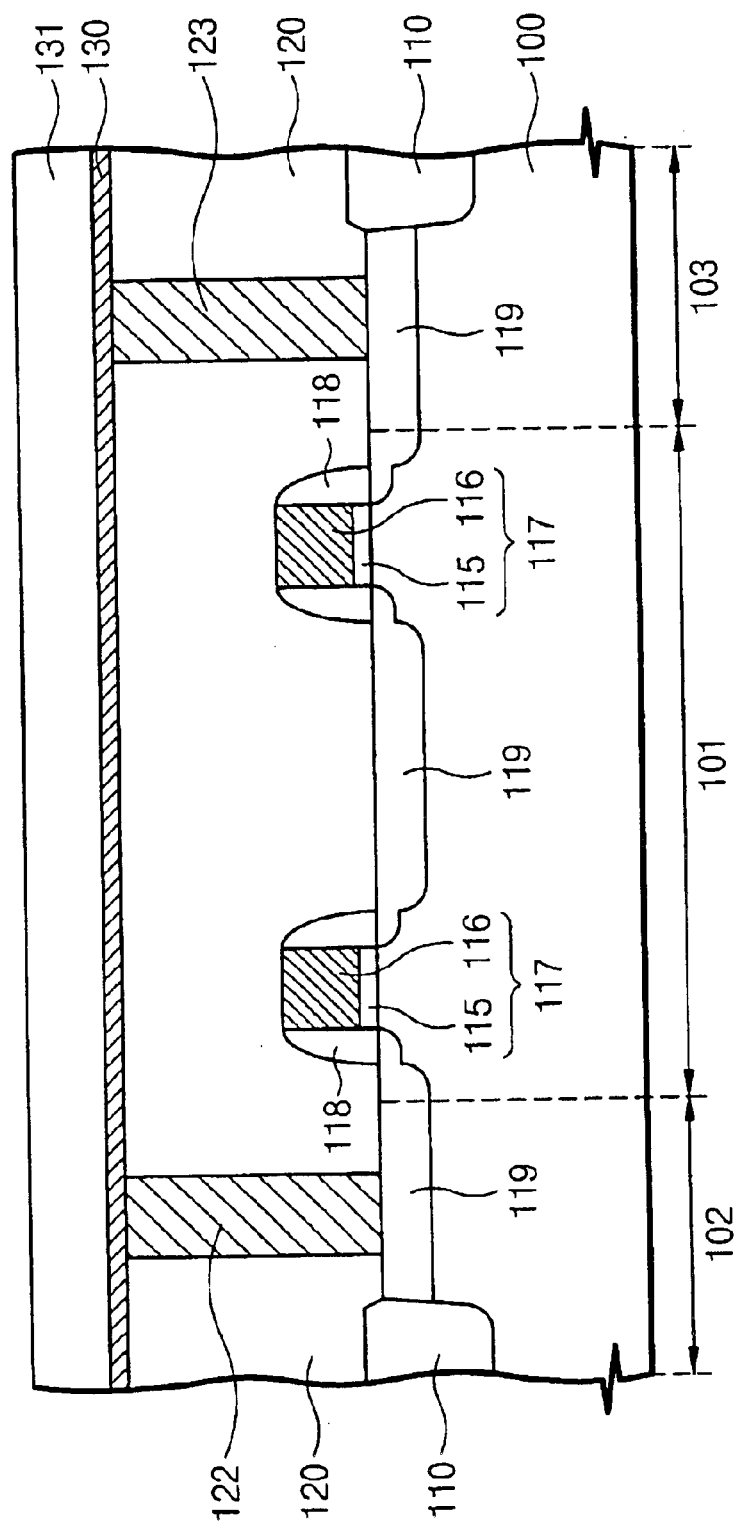
FIGS. 11 and 12 are cross-sectional views illustrating processing steps in the fabrication of phase changeable memory devices according to some embodiments of the present invention, for example, embodiments of phase changeable memory devices illustrated in FIG. 7A.
Figure 12:
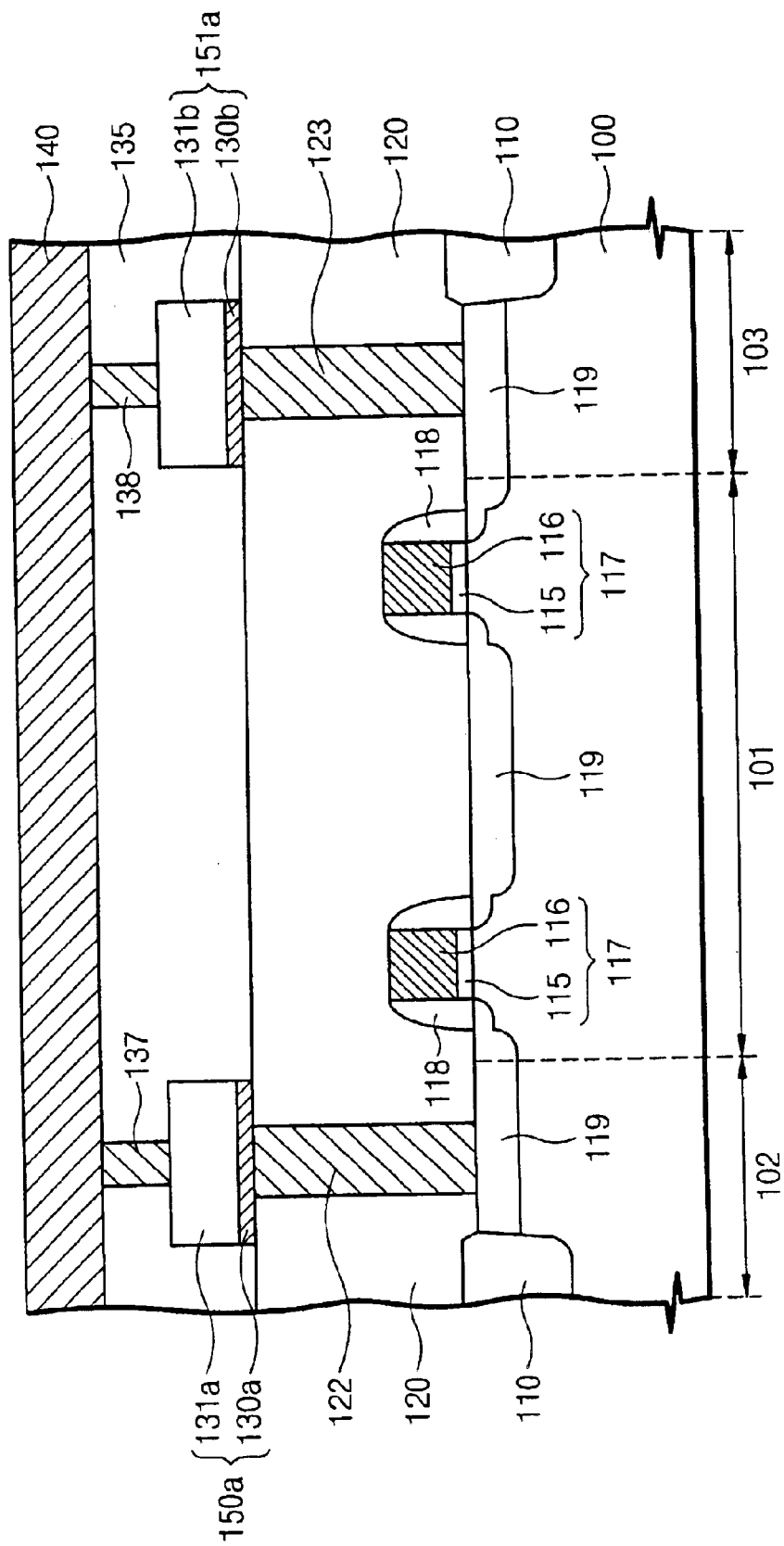
Figure 13:
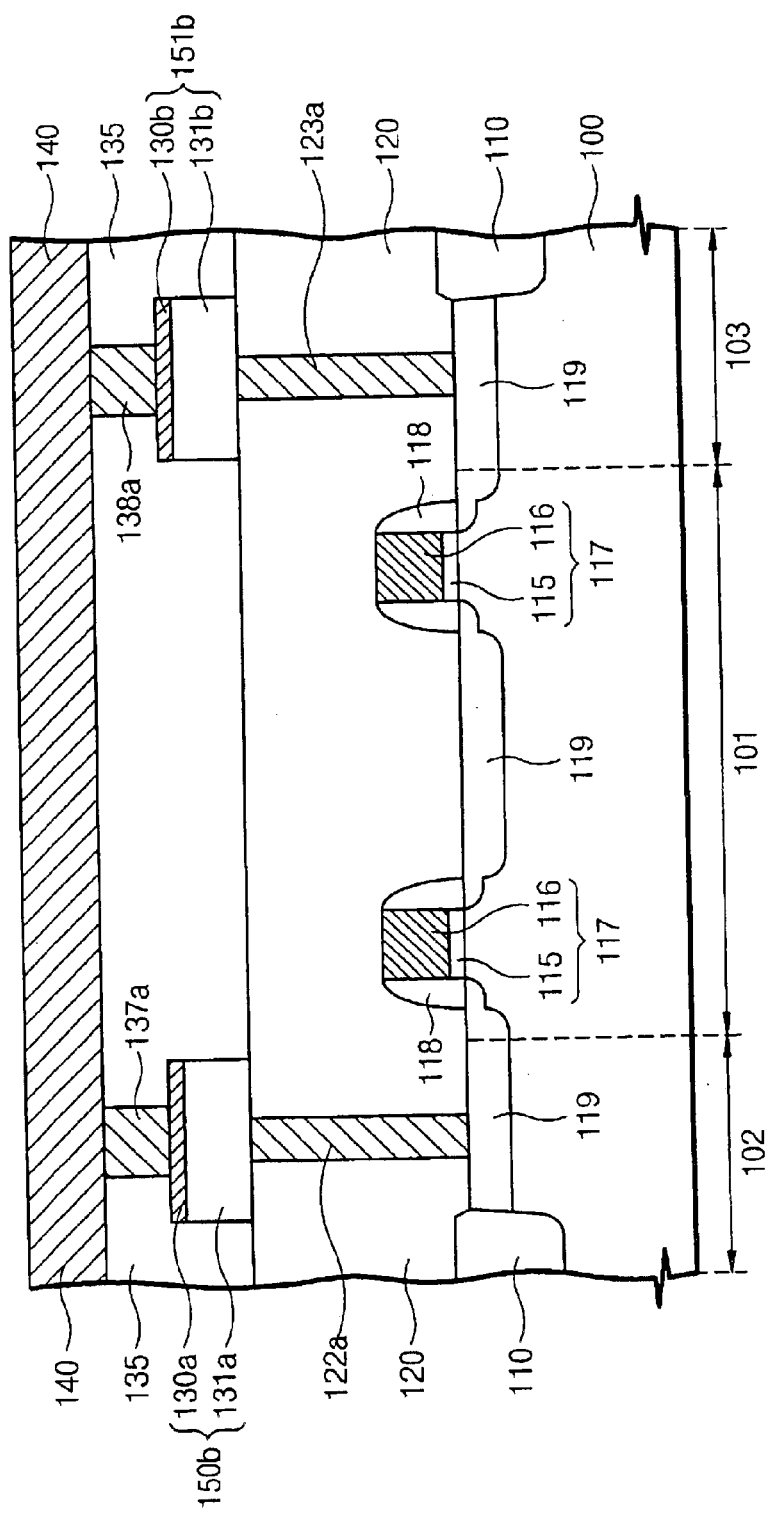
FIG. 13 is a cross-sectional view illustrating processing steps in the fabrication of phase changeable memory devices according to further embodiments of the present invention, for example, embodiments of phase changeable memory devices illustrated in FIG. 7B.

Methods for forming phase changeable memory devices according to embodiments of the present invention will be discussed. FIGS. 11 and 12 are cross-sectional views illustrating processing steps in the fabrication of phase changeable memory devices according to some embodiments of the present invention, for example, embodiments of the present invention illustrated in FIG. 7A. FIG. 13 is a cross-sectional view illustrating processing steps in the fabrication of phase changeable memory devices according to further embodiments of the present invention, for example, embodiments of the present invention illustrated in FIG. 7B.

Referring now to FIGS. 6 and 11, a device isolation layer 110 is formed on an integrated circuit substrate 100 to define a plurality of active regions 104 and connector active regions 105. The active regions 104 are formed to be two-dimensionally disposed along rows and columns and the connector active regions 105 are disposed between the active regions 104. Ones of the active regions 104 include a transistor active region 101, a first storage active region 102 and a second storage active region. The transistor active region 101 includes first and second sidewalls 200 and 201 and the first and second sidewalls have first and second ends. The first storage active region 102 protrudes from the first sidewall 200 at the first end. The second storage active region 103 protrudes from the second sidewall 201 at the second end. Ones of the connector active regions 105 are formed between the adjoining transistor active regions 101. The device isolation layer 110 may be, for example, a trench isolation layer.

A gate insulating layer and a gate electrode layer are sequentially formed on a surface of the integrated circuit substrate 100 including the device isolation layer 110. The gate insulating layer and the gate electrode layer are successively patterned to form a plurality of gate lines 117 crossing over the transistor active regions 101. The gate lines 117 are parallel to the rows. A plurality of gate lines 117, for example, two gate lines 117, cross over ones of the transistor active regions 101. Ones of the gate lines 117 include a gate insulating pattern 115 on the integrated circuit substrate 100 and a gate electrode 116 on the gate insulating pattern 115. Spacers 118 may be formed on the sidewalls of the gate lines 117. Using the gate lines 117 and the spacers 118 as a mask, impurity ions may be implanted into the integrated circuit substrate 100 to form impurity diffusion layers 119 in the active regions 104 and the connector active regions 105. The impurity diffusion layers 119 formed in the first and second storage active regions 102 and 103 correspond to drain regions. The impurity diffusion layers 119 in the transistor active regions 101 between the gate lines 117 correspond to a common source region. A metal silicide layer may optionally be formed on the impurity diffusion layer 119 and the gate electrodes 116 (not shown).

A lower interlayer dielectric 120 is formed on a surface of an integrated circuit substrate 100 including the impurity diffusion layers 119. The lower interlayer dielectric 120 may include, for example, a silicon oxide layer. First and second lower plugs 122 and 123 are formed in the lower interlayer dielectric 120. The first and second lower plugs 122 and 123 are in contact with the first and second storage active regions 102 and 103, respectively. The first and second lower plugs 122 and 123 may include, for example, tungsten. A barrier layer 130 and a phase changeable material layer 131 are sequentially formed on a surface of an integrated circuit substrate 100 having the first and second lower plugs 122 and 123. The barrier layer 130 may include, for example, metal nitride, such as titanium nitride or tantalum nitride. The phase changeable material layer 131 may be formed of a material layer including at least one of tellurium Te and/or selenium Se, which belong to Chalcogenide family of elements. For example, the phase changeable material layer 131 may be formed of, for example, GST.

Referring now to FIGS. 6, 12 and 7A, the phase changeable material layer 131 and the barrier layer 130 are successively patterned to form first and second data storage elements 150a and 151a that are formed on the first and second lower plugs 122 and 123, respectively. The first data storage element 150a includes a first barrier pattern 130a formed on the first lower plug and a first phase changeable material pattern 131a formed on the first barrier pattern 130a. The second data storage element 151a includes a second barrier pattern 130b formed on the second lower plug and a second phase changeable material pattern 131b formed on the second barrier pattern 130b.

An upper interlayer dielectric 135 is formed on a surface of an integrated circuit substrate 100 including the first and second data storage elements 150a and 151b. The upper interlayer dielectric 135 may include, for example, a silicon oxide layer. First and second upper plugs 137 and 138 are formed in the upper interlayer dielectric 135. The first and second upper plugs 137 and 138 are in contact with the first and second phase changeable material patterns 131a and 131b, respectively. The first and second upper plugs 137 and 138 may include heater plugs. The heater plugs may include, for example, TiN, TaN, WN, MoN, NbN, TiSiN, TiAlN, TiBN, ZrSiN, WBN, ZrAlN, MoSiN, MoAlN, TaSiN, TaAlN, TiON, TiAlON, WON and/or TaON. The first and second upper plugs 137 and 138 may have smaller diameters than the diameters of the first and second lower plugs 122 and 123.

A bit line conductivity layer 140 is formed on an integrated circuit substrate 100 have the first and second upper plugs 137 and 138. The bit line conductivity layer 140 may include, for example, tungsten. The bit line conductivity layer 140 is patterned to form a plurality of bit lines 140a crossing over the gate lines 117 as illustrated in FIGS. 6 and 7A.

Methods of forming phase changeable memory devices according to further embodiments of the present invention will be discussed with respect to FIG. 7B. Processing steps in the fabrication of the lower interlayer dielectric 120 are similar to those steps discussed above with respect to FIG. 7A and therefore will not be discussed further herein.

Referring now to FIGS. 7B and 13, first and second lower plugs 122a and 123a are formed in the lower interlayer dielectric 120. The first and second lower plugs 122a and 123a are in contact with the first and second storage active regions 102 and 103, respectively. The first and second lower plugs 122a and 123a include heater plugs. As discussed above, the heater plugs may include, for example, TiN, TaN, WN, MoN, NbN, TiSiN, TiAlN, TiBN, ZrSiN, WBN, ZrAlN, MoSiN, MoAlN, TaSiN, TaAlN, TiON, TiAlON, WON and/or TaON.

A phase changeable material layer and a barrier layer are sequentially formed on a surface of an integrated circuit substrate 100 including the first and second lower plugs 122a and 123a. The barrier layer and the phase changeable material layer are successively patterned to form first and second data storage elements 150b and 151b that are provided on the first and second lower plugs 122a and 123a, respectively. The first data storage element 150b includes the first phase changeable material pattern 131a and the first barrier pattern 130a, which are sequentially stacked. The second data storage element 151b includes the second phase changeable material pattern 131b and the second barrier pattern 130b, which are sequentially stacked. An upper interlayer dielectric 135 is formed on a surface of an integrated circuit substrate 100 including the first and second data storage elements 150b and 151b. First and second upper plugs 137a and 138a are formed in the upper interlayer dielectric 135 and in contact with the first and second data storage regions 150b and 151b, respectively. The first and second upper plugs 137a and 138a may be formed of, for example, tungsten. A bit line conductivity layer 140 is formed on an integrated circuit substrate 100 including the first and second upper plugs 137a and 138a. The bit line conductivity layer is patterned to form a plurality of bit lines 140a crossing over gate electrodes 117.

FIGS. 10 and 14 through 16 are cross-sectional views illustrating processing steps in the fabrication of phase changeable memory devices according to some embodiments of the present invention. The processing steps in the fabrication of the active regions, the gate lines and the lower interlayer dielectric are the similar to those discussed with respect to FIG. 11 and will not be discussed further herein.

Figure 14:
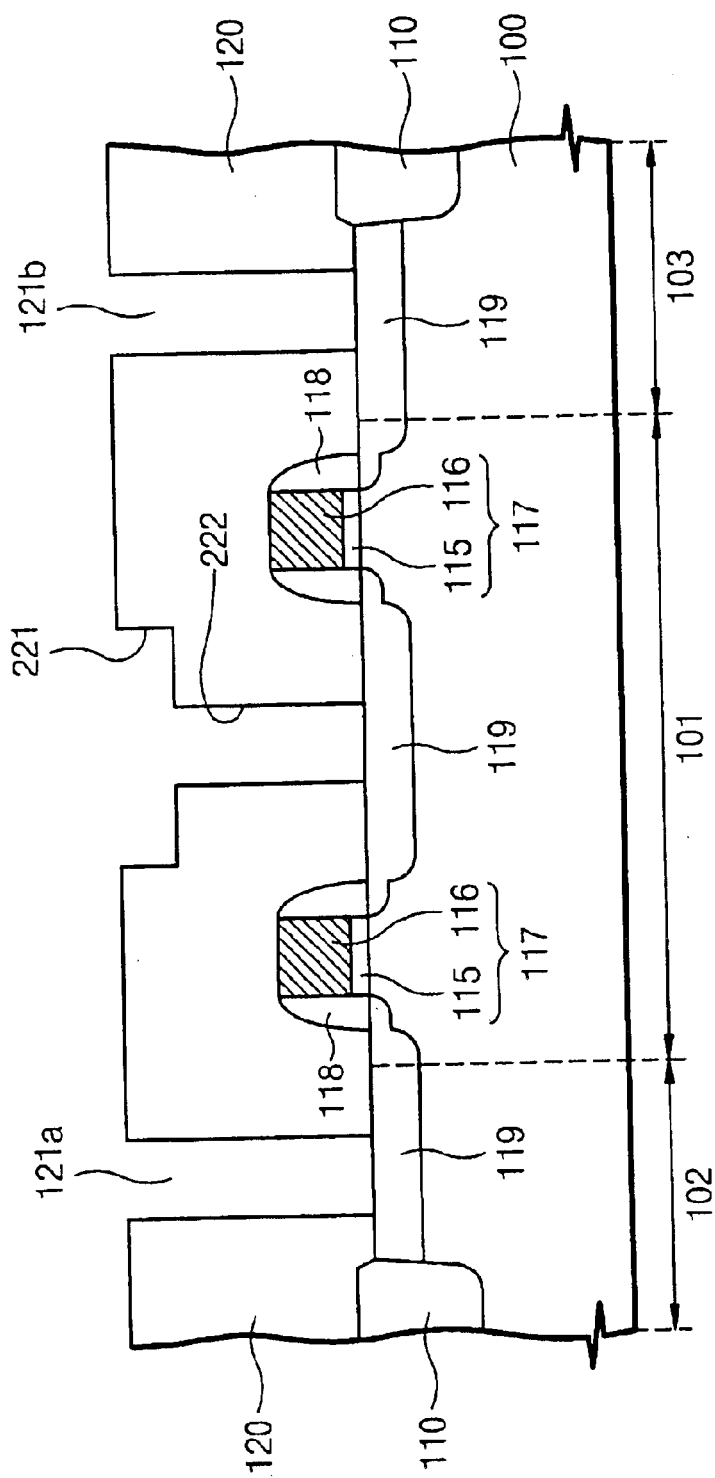
FIGS. 14–16 are cross-sectional views illustrating processing steps in the fabrication of phase changeable memory devices according to some embodiments of the present invention, for example, embodiments of phase changeable memory devices illustrated in FIG. 10A.
Figure 15:
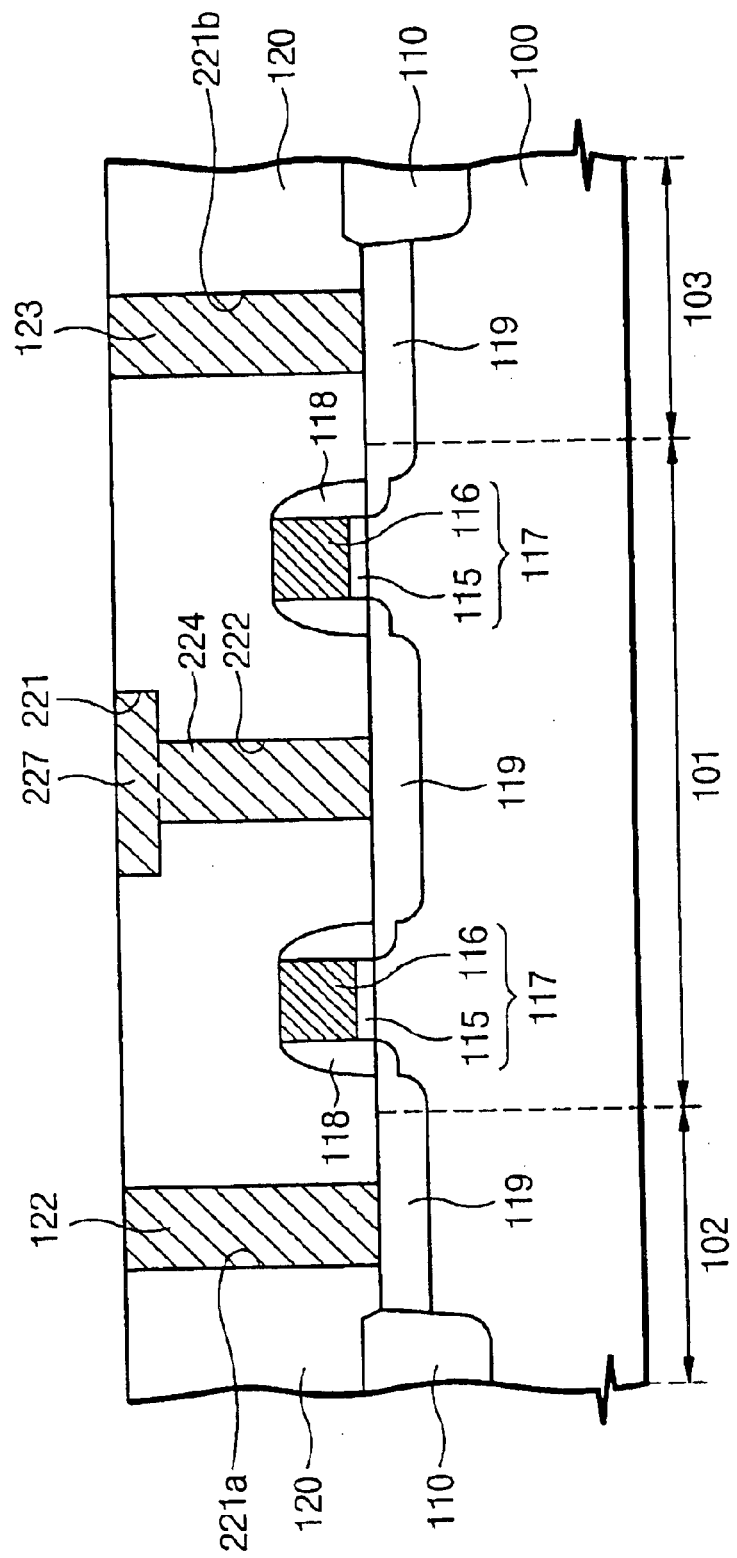

Referring now to FIGS. 9, 14 and 15, a lower interlayer dielectric 120 is patterned to form a plurality of interconnection trenches 221 have a predetermined depth. Ones of the interconnection trenches 221 cross over common source regions CSR disposed in each of the rows. A lower surface of the interconnection trench 221 may be positioned on an upper surface of the gate line 117. Common source contact holes 222 are formed in the interconnection trench 221, thereby exposing regions of the common source regions CSR. The first and second lower contact holes 121a and 121b are formed in the lower interlayer dielectric 120, thereby exposing portions of the first and second storage active regions 102 and 103, respectively. The common source contact holes 222 and the first and second lower contact holes 121a and 121b may be formed at the same time and the common source contact holes 222 and the first and second lower contact holes 121a and 121b may be sequentially formed.

A conductive layer is formed on a surface of the integrated circuit substrate 100 including the common source contact hole 222, the interconnection trench 221 and the first and second lower contact holes 121a and 121b. The conductivity layer is formed in the common source contact hole 222, the interconnection trench 221 and the first and second contact holes 121a and 121b. The conductivity layer is planarized until at least a portion of the lower interlayer dielectric 120 is exposed, thereby forming a common source interconnection 227 and first and second lower plugs 122 and 123. The conductivity layer may include, for example, tungsten.

Figure 16:
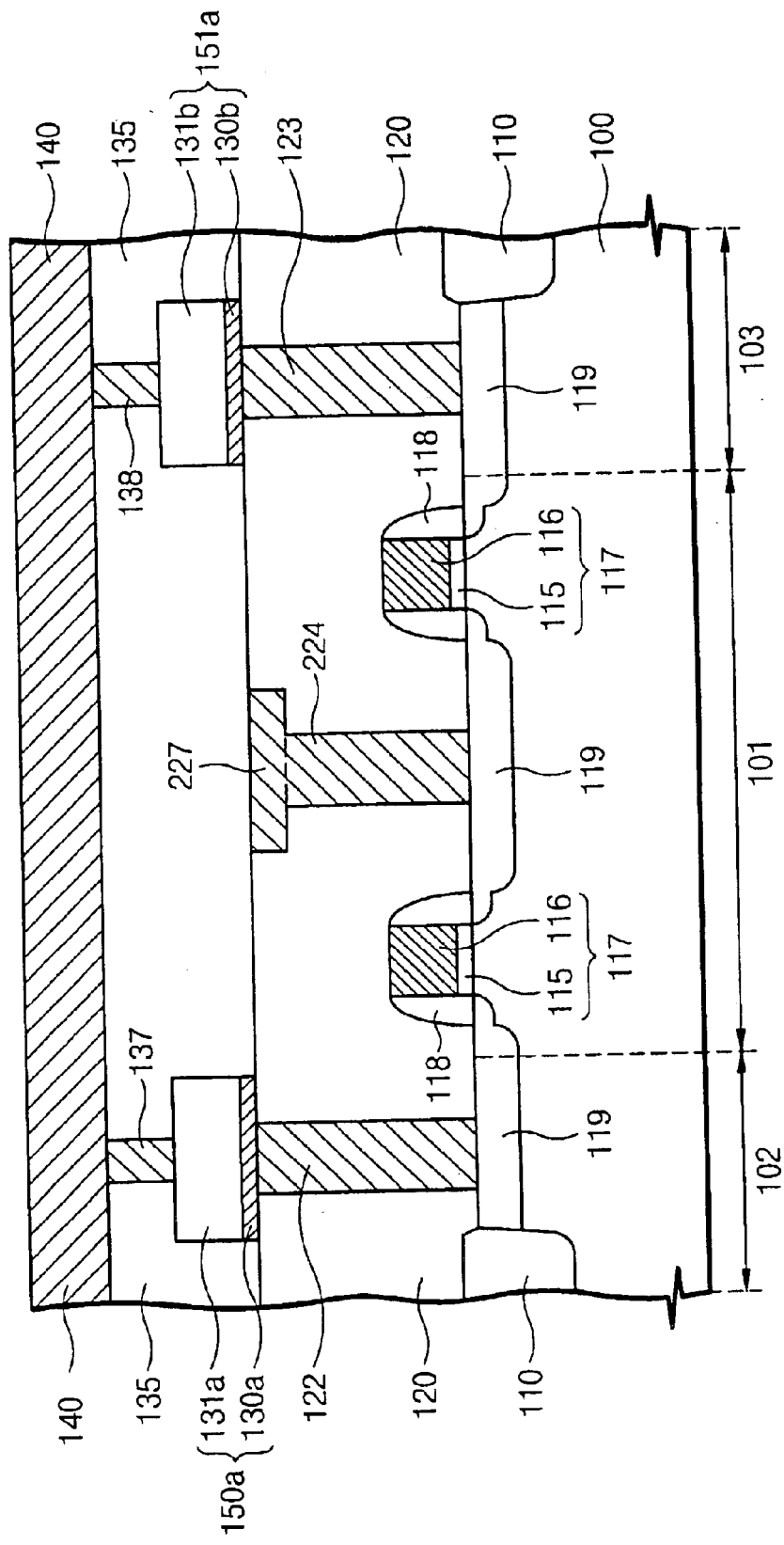

Referring to FIGS. 16 and 10A, a barrier layer and a phase changeable material layer are sequentially formed on a surface of an integrated circuit substrate 100 including the common source interconnections 227. The phase changeable material layer and the barrier layer are successively patterned to form first and second data storage elements 150a and 151a, which are located on the first and second lower plugs 122 and 123, respectively. The first data storage element 150a comprises a first barrier pattern 130a and first phase changeable material pattern 131a, which are sequentially stacked. The second data storage element 151a comprises a second barrier pattern 130b and a second phase changeable material pattern 131b, which are sequentially stacked.

An upper interlayer dielectric 135 is formed on a surface of an integrated circuit substrate 100 including the first and second data storage elements 150a and 151a. First and second upper plugs 137 and 138 are formed in the upper interlayer dielectric 135. The first and second upper plugs 137 and 138 are in contact with the first and second phase changeable patterns 131a and 131b, respectively. The first and second upper plugs 137 and 138 include, for example, heater plugs.

A bit line conductivity layer 140 is formed on a surface of an integrated circuit substrate 100 including the first and second upper plugs 137 and 138. The bit line conductivity layer 140 is patterned to form a plurality of bit lines 140a crossing over the gate lines 117.

Processing steps in the fabrication of embodiments of the phase changeable memory device according to embodiments of the present invention illustrated in FIG. 10B will be discussed. In certain embodiments of the present invention, the common source interconnections 227, the common source plugs 224, first and second lower plugs 122a and 123a including heater plugs may not be formed at the same time. In some embodiments of the present invention, the first and second lower plugs 122a and 123a are formed and then the common source interconnections 227 and the common source plugs 224 may be formed. In further embodiments of the present invention, the common source interconnection 227 and the common source plugs 224 may be formed and then the first and second lower plugs 122a and 123a may be formed.

As discussed above with respect to FIGS. 4 through 16, the active regions include a transistor active region and first and second storage active regions. Widths of the first and second storage active regions are less than a channel width of the transistor active region. In some embodiments of the present invention, the first and second widths are equal to about half the channel width. Accordingly, an area of the phase changeable memory device may be decreased by the decreased widths of the first and second storage active regions. Furthermore, the first and second storage active regions may be disposed alternately along the rows. This placement of the first and second active regions may further decrease the cell area of the phase changeable memory device compared to conventional phase changeable memory devices.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A phase changeable memory device comprising:

an integrated circuit substrate;

a first storage active region on the integrated circuit substrate having a first width;

a second storage active region on the integrated circuit substrate having a second width; and a transistor active region on the integrated circuit substrate between the first and second storage active regions, the first and seconds widths being less than a width of the transistor active region.

2. A device according to claim 1 wherein the first width is equal to the second width and the first and second widths are a out half of the width of the transistor active region.

3. A device according to claim 1 further comprising a plurality of gate lines defining a plurality of rows of the phase changeable memory device, wherein a plurality of the first and second storage active regions are disposed alternately along the rows in a region between first and second gate lines of the plurality of gate lines and wherein the widths of the first and second storage active regions and he width of the transistor active region are parallel to the plurality of gate lines.

4. A device according to claim 1 wherein the transistor active region comprises first and second sidewalls extending from a first end of the transistor active region to a second end of the transistor active region, wherein the first storage active region protrudes from the first sidewall of the transistor active region at the first end of the transistor active region and wherein the second storage re ion protrudes from the second sidewall of the transistor active region at the second end of the transistor active region.

5. A device according to claim 1 herein the transistor active region is a first transistor active region, the device further comprising:

a second transistor active region; and a connector active region between the first transistor active region and the second transistor active region that electrically couples the first and second transistor active regions.

6. A device according to claim 1 further comprising:

a first data storage element on the first storage active region;

a second data storage element on the second storage active region;

a first lower plug that electrically couples the first data storage element to the first storage active region; and a second lower plug that electrically couples the second data storage element to the second data storage region.

7. A device according to claim 6 further comprising:

a plurality of bit lines on the integrated circuit substrate;

a first upper plug that electrically couples first bit line of the plurality of bit lines to the first data storage element; and a second upper plug that electrically couples a second bit line of the plurality of bit lines to the second data storage element.

8. A device according to claim 7:

wherein the first data storage element comprises a first barrier pattern that is electrically coupled to the first lower plug and a first phase changeable material pattern on the first barrier pattern;

wherein the second data storage element comprises a second barrier pattern that is electrically coupled to the second lower plug and a second phase changeable material pattern on the second barrier pattern; and wherein the first and second upper plugs comprise heater plugs that generate heat to provide a phase transformation of the first phase changeable material pattern and the second phase changeable material pattern, respectively.

9. A device according to claim 8 wherein a diameter of the first lower plug is larger than a diameter of the first upper plug and wherein a diameter of the second lower plug is larger than a diameter of the second upper plug.

10. A device according to claim 7:

wherein the first data storage element comprises a first phase changeable material pattern that is electrically coupled to the first lower plug and a first barrier pattern on the first phase changeable material pattern;

wherein the second data storage element comprises a second phase changeable material pattern that is electrically coupled to the second lower plug and a second barrier pattern on the second phase changeable material pattern; and wherein the first and second lower plugs comprise heater plugs that generate heat to provide a phase transformation of the first phase changeable material pattern and the second phase changeable material pattern, respectively.

11. A device according to claim 10 wherein a diameter of the first lower plug is less than a diameter of the first upper plug and wherein a diameter of the second lower plug is less than a diameter of the second upper plug.

12. A device according to claim 7 further comprising:
a common source interconnection on the integrated circuit substrate; and
a common source plug that electrically couples the common source interconnection to the transistor active region.

13. A device according to claim 12 further comprising an interlayer dielectric on the integrated circuit substrate, wherein the common source plug is disposed in the interlayer dielectric and wherein the common source interconnection is disposed in the interlayer dielectric on the common source plug.

14. A device according to claim 1 further comprising:
a first data storage element on the first storage active region;
a second data storage element on the second storage active region;
first and second lower plugs on the integrated circuit substrate;
a first buffer pattern on the first lower plug;
a second buffer pattern on the second lower plug;
a first intermediate plug on the first buffer pattern that electrically couples the first data storage element to the first storage active region; and
a second intermediate plug on the second buffer pattern that electrically couples the second data storage element to the second data storage region.

15. A device according to claim 14 further comprising:
a plurality of bit lines on the integrated circuit substrate;
a first upper plug that electrically couples a first bit line of the plurality of bit lines to the first data storage element; and
a second upper plug that electrically couples a second bit line of the plurality of bit lines to the second data storage element.

16. A device according to claim 15:
wherein the first data storage element comprises a first barrier pattern that is electrically coupled to the first intermediate plug and a first phase changeable material pattern on the first barrier pattern;
wherein the second data storage element comprises a second barrier pattern that is electrically coupled to the second intermediate plug and a second phase changeable material pattern on the second barrier pattern; and
wherein the first and second upper plugs comprise heater plugs that generate heat to provide a phase transformation of the first phase changeable material pattern and the second phase changeable material pattern, respectively.

17. A device according to claim 15:
wherein the first data storage element comprises a first phase changeable material pattern that is electrically coupled to the first intermediate plug and a first barrier pattern on the first phase changeable material pattern;
wherein the second data storage element comprises a second phase changeable material pattern that is electrically coupled to the second intermediate plug and a second barrier pattern on the second phase changeable material pattern; and
wherein the first and second intermediate plugs comprise heater plugs that generate heat to provide a phase transformation of the first phase changeable material pattern and the second phase changeable material pattern, respectively.

18. A device according to claim 14 further comprising:
a common source interconnection on the integrated circuit substrate; and
a common source plug that electrically couples the common source interconnection to the transistor active region.

19. A device according to claim 18 further comprising an interlayer dielectric on the integrated circuit substrate wherein the common source plug is disposed in the interlayer dielectric and wherein the common source plug is dispose on the interlayer dielectric.

20. A phase changeable memory device comprising:
an integrated circuit substrate;
a first storage active region on the integrated circuit substrate having a first cross sectional area;
a second storage active region on the integrated circuit substrate having a second cross sectional area; and
a transistor active region on the integrated circuit substrate between the first and second storage active regions, the first and seconds cross sectional areas being less than a cross sectional area of the transistor active region.

* * * * *

UNITED STATES PATENT AND TRADEMARK OFFICE
CERTIFICATE OF CORRECTION

PATENT NO.    : 6,849,892 B2
DATED         : February 1, 2005
INVENTOR(S)   : Hideki It is certified that error appears in the above-identified patent and that said Letters Patent is hereby corrected as shown below:

Column 16,
Line 16, should read -- are about half of the width of the transistor active region. --
Line 33, should read -- region and wherein the second storge region protrudes from --
Line 36, should read -- 5. A device according to claim 1 wherein the transistor --

Signed and Sealed this

Seventh Day of June, 2005

JON W. DUDAS
*Director of the United States Patent and Trademark Office*